United States Patent
Jung et al.

(10) Patent No.: US 10,004,151 B2
(45) Date of Patent: Jun. 19, 2018

(54) DISPLAY APPARATUS

(71) Applicant: SAMSUNG ELECTRONICS CO., LTD., Gyeonggi-do (KR)

(72) Inventors: Sung Soo Jung, Suwon-si (KR); Dae Sung Ko, Seoul (KR); Song Hyeon Kim, Incheon (KR); Jeong Roh Lee, Hwaseong-si (KR); Jin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/634,398

(22) Filed: Jun. 27, 2017

(65) Prior Publication Data

US 2017/0295655 A1    Oct. 12, 2017

Related U.S. Application Data

(62) Division of application No. 14/589,285, filed on Jan. 5, 2015, now Pat. No. 9,727,080.

(30) Foreign Application Priority Data

Jan. 3, 2014  (KR) .................. 10-2014-0000648
Jun. 24, 2014  (KR) .................. 10-2014-0077499
Nov. 7, 2014  (KR) .................. 10-2014-0154798

(51) Int. Cl.
*H05K 7/00*     (2006.01)
*H05K 5/00*     (2006.01)
(Continued)

(52) U.S. Cl.
CPC ......... *H05K 5/0017* (2013.01); *H05K 5/0217* (2013.01); *G02F 1/133305* (2013.01);
(Continued)

(58) Field of Classification Search
CPC ...................................... H05K 1/189
(Continued)

(56) References Cited

U.S. PATENT DOCUMENTS 8,243,424 B1  8/2012 Babu et al.
2013/0010405 A1  1/2013 Rothkopf et al.
(Continued)

FOREIGN PATENT DOCUMENTS

KR    1020130070423 A    6/2013
KR    1020130138614 A    12/2013

OTHER PUBLICATIONS

Communication dated Jun. 12, 2017, from the European Patent Office in counterpart European Application No. 15733286.7.
(Continued)

*Primary Examiner* — Jerry Wu
(74) *Attorney, Agent, or Firm* — Sughrue Mion, PLLC

(57) ABSTRACT

A display apparatus having a display module which may be selectively set to a flat surface state or a curved surface state. The display apparatus having a display module includes a bendable display panel configured to display images, a first frame provided at a front of the display panel, and a second frame provided at a back of the display panel. The second frame includes a first bracket positioned at a back of the display panel, and a second bracket provided to be slidable with respect to the first bracket.

5 Claims, 40 Drawing Sheets

(51) Int. Cl.
*H05K 5/02* (2006.01)
*G02F 1/1333* (2006.01)
*H01L 51/52* (2006.01)
*H01L 51/00* (2006.01)

(52) U.S. Cl.
CPC ...... *H01L 51/0097* (2013.01); *H01L 51/5237* (2013.01); *H01L 2251/5338* (2013.01)

(58) Field of Classification Search
USPC .................................................. 361/679.21
See application file for complete search history.

(56) References Cited

U.S. PATENT DOCUMENTS

| | | |
|---|---|---|
| 2013/0037228 A1 | 2/2013 | Verschoor et al. |
| 2013/0114193 A1 | 5/2013 | Joo et al. |
| 2013/0155655 A1 | 6/2013 | Lee et al. |
| 2013/0207946 A1 | 8/2013 | Kim et al. |
| 2013/0321740 A1 | 12/2013 | An et al. |
| 2014/0226266 A1* | 8/2014 | Kang .................. H01L 51/0097 361/679.01 |
| 2014/0240906 A1* | 8/2014 | Seo ........................ A47B 81/06 361/679.01 |

OTHER PUBLICATIONS

Communication dated Mar. 30, 2015 by the International Searching Authority in related Application No. PCT/KR2015/000033.
Communication dated Feb. 22, 2018, issued by the European Patent Office in counterpart European application No. 15 733 286.7.

* cited by examiner

DISPLAY APPARATUS

CROSS-REFERENCE TO RELATED
APPLICATION(S)

This application is a divisional application of U.S. application Ser. No. 14/589,285 filed Jan. 5, 2015, which claims the benefit of priority from Korean Patent Applications No. 10-2014-0000648, filed on Jan. 3, 2014, No. 10-2014-0077499, filed on Jun. 24, 2014 and No. 10-2014-0154798 filed on Nov. 7, 2014, in the Korean Intellectual Property Office, the disclosures of which are incorporated herein by reference in their entirety.

BACKGROUND

1. Field

An apparatus consistent with exemplary embodiments broadly relates to a display apparatus having a display module which may be used by being set to a flat surface state or a curved surface state.

2. Description of the Related Art

A display apparatus generally includes a display module to display images. Examples of the display apparatus include a television and a monitor. Among such display apparatuses, there is a display apparatus using a display module including an organic light emitting diode panel.

A display apparatus making the user feel like they are viewing three-dimensional images through two-dimensional images by fixing the display panel in the form of a curved surface has recently been proposed.

When the display panel is switched between the flat surface state and the curved surface state, the front surface part and the rear surface part have different curvatures, and accordingly, a difference in length between the front surface and rear surface of the display panel may be produced. That is, according to the arc lengths of the front surface part and the rear surface part, a difference in lengths is produced at the ends of the front surface part and the rear surface part. At this time, optimum disposition and the dimensions of components may vary, and thus degradation of performance of a product or damage to a product may occur.

SUMMARY

It is an aspect of exemplary embodiments to provide a display apparatus having a display module including: including: a bendable display panel configured to display images; a first frame provided at a front of the display panel; and a second frame provided at a back of the display panel, where the second frame includes: a first bracket positioned at a back of the display panel; and a second bracket provided to be slidable with respect to the first bracket.

The display apparatus may further include a connecting member configured to connect the first frame to the second frame such that the first frame and the second frame move relative to each other, wherein the connecting member is fixed to the second frame while passing through the first frame.

The connecting member may include: a head; a first support integrally formed at a lower end of the head; and a second support extending from a lower end of the first support, where the second support is provided with threads.

The first frame may be provided with a fastening hole configured to receive, in a sliding manner, the first support of the connecting member.

The fastening hole may be a long hole formed in the first frame.

The first bracket may be provided with a connecting hole to fix the second support of the connecting member.

The first bracket may include a cover provided with a guide allowing the second bracket to slide thereon.

The connecting member may move according to movement of the first bracket.

The second bracket may be coupled to a side screw such that the second bracket is slidable between the first bracket and the guide; and the slide screw may include a two-stage screw.

The display panel may include an organic light emitting diode panel.

The display apparatus may further include a driving apparatus positioned at a back of the display module such that the display module is deformable from one of a flat surface state and a curved surface state into the other state.

The display apparatus may further include a base member positioned at a back of the display module to support the driving apparatus.

The driving apparatus may include: a driver installed on the base member to generate a driving force; moving members moved by the driver in opposite directions to each other, and rotating members rotatably connected to the moving members so as to rotate both ends of the display module in forward and backward directions.

The moving member may further include a fine adjustment apparatus configured to finely adjust left and right balance of the display module.

The moving member may further include a guide configured to guide movement of the moving member.

The display apparatus may include a sensor configured to measure a moving distance of the moving member.

The display apparatus may include a shield positioned at a back of the display module, which rotates together when both ends of the display module move forward, and covers a space between the display module and the base member.

It is another aspect of an exemplary embodiment to provide a display apparatus having a display including: a display module including: a bendable display panel configured to display images; a top chassis configured to accommodate a front of the display panel; a first bottom chassis configured to support a back of the display panel; and a second bottom chassis configured to slide from the first bottom chassis; and a connecting member configured to connect the top chassis and the second bottom chassis in a relatively movable manner.

The connecting member may include: a head; a first support integrally formed at a lower end of the head; and a second support extending from a lower end of the first support, where the second support is provided with threads.

The first frame may be provided with a fastening hole configured to slidably receive the first support of the connecting member, where the fastening hole is a long hole.

The display panel may include an organic light emitting diode panel.

The display apparatus may further include a driving apparatus positioned at a back of the display module such that the display module is switched into one of a flat surface state and a curved surface state.

The driving apparatus may include: a driver fixed to a base member positioned at a back of the display module so as to generate a driving force; moving members moved by the driver in opposite directions with respect to each other; and rotating members rotatably connected to the moving members so as to rotate both ends of the display module in forward and backward directions.

It is another aspect of an exemplary embodiment to provide a display apparatus including: a display panel bendably provided to switch into at least one of a flat surface state and a curved surface state; a top chassis provided at a front of the display panel; and a bottom chassis provided at a back of the display panel so as to be movable relative to the top chassis.

The bottom chassis may include: a first bottom chassis configured to support a back of the display panel; and a second bottom chassis configured to slide from the first bottom chassis, where the second bottom chassis may relatively move along the top chassis.

The display apparatus may further include a connecting member configured to connect the top chassis and the bottom chassis in a relatively movable manner, where the connecting member may be fixed to the bottom chassis by passing through the top chassis.

The connecting member may include: a head; a first support integrally formed at a lower end of the head; and a second support extending from a lower end of the first support, where the second support is provided with threads.

The top chassis may be provided with a fastening hole configured to receive the first support, wherein the fastening hole is a long hole.

The bottom chassis may be provided with a connecting hole to fix the second support of the connecting member.

It is still another aspect of an exemplary embodiment to provide a display apparatus having a display module including: a display panel in which images are displayed, and a frame configured to support the display panel; a driving apparatus provided at a back of the display module such that the display panel is changed to one of a flat surface state and a curved surface state; a base member positioned at the back of the display module and configured to support the driving apparatus; and a stand member configured to support the display module, wherein the frame includes: a first bracket positioned at a back of the display panel; and a second bracket that is slidably provided in the first bracket.

The stand may further include a speaker that may be changed to have a variable curvature of the display module by the driving apparatus.

The display apparatus may include a connecting member configured to connect the first bracket and the second bracket in a relatively movable manner, where the connecting member passes through the second bracket and is fixed to the first bracket.

BRIEF DESCRIPTION OF THE DRAWINGS

These and/or other aspects of exemplary embodiments will become apparent and more readily appreciated from the following description of certain exemplary embodiments, taken in conjunction with the accompanying drawings, in which.

DETAILED DESCRIPTION OF EXEMPLARY EMBODIMENTS

Figure 1:
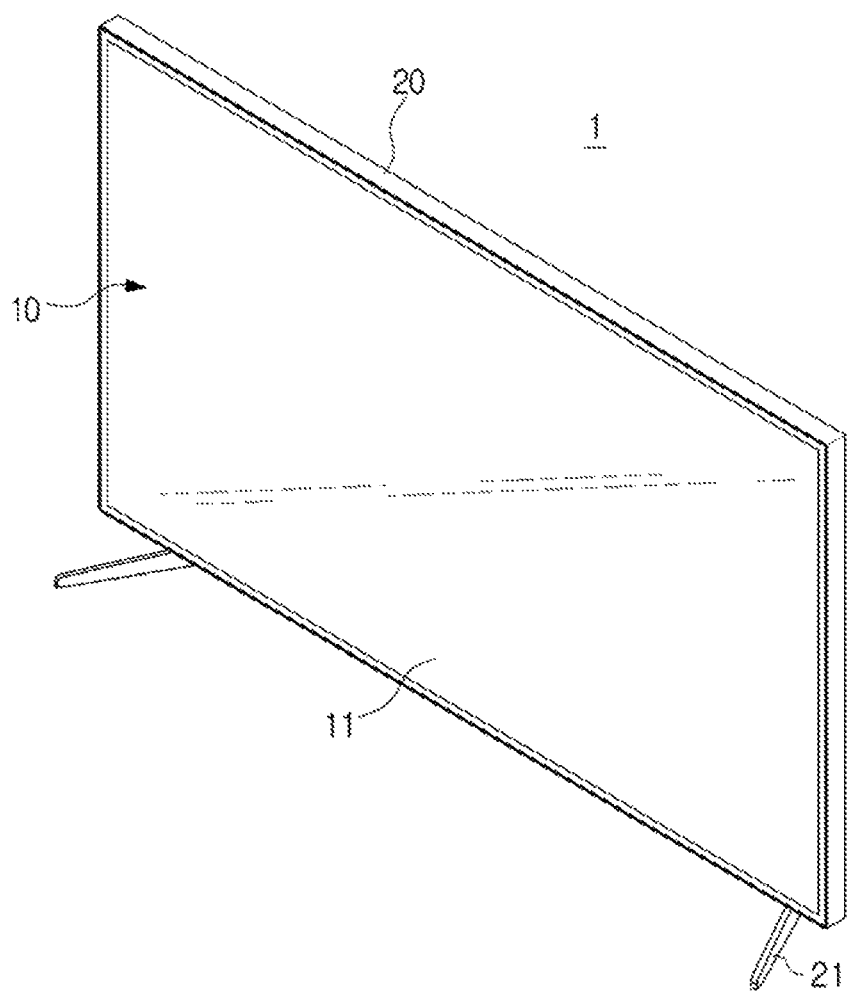
FIG. 1 is a perspective view schematically illustrating a display apparatus according to an exemplary embodiment.

Reference will now be made in detail to exemplary embodiments, examples of which are illustrated in the accompanying drawings, wherein like reference numerals refer to analogous elements throughout.

Figure 2:
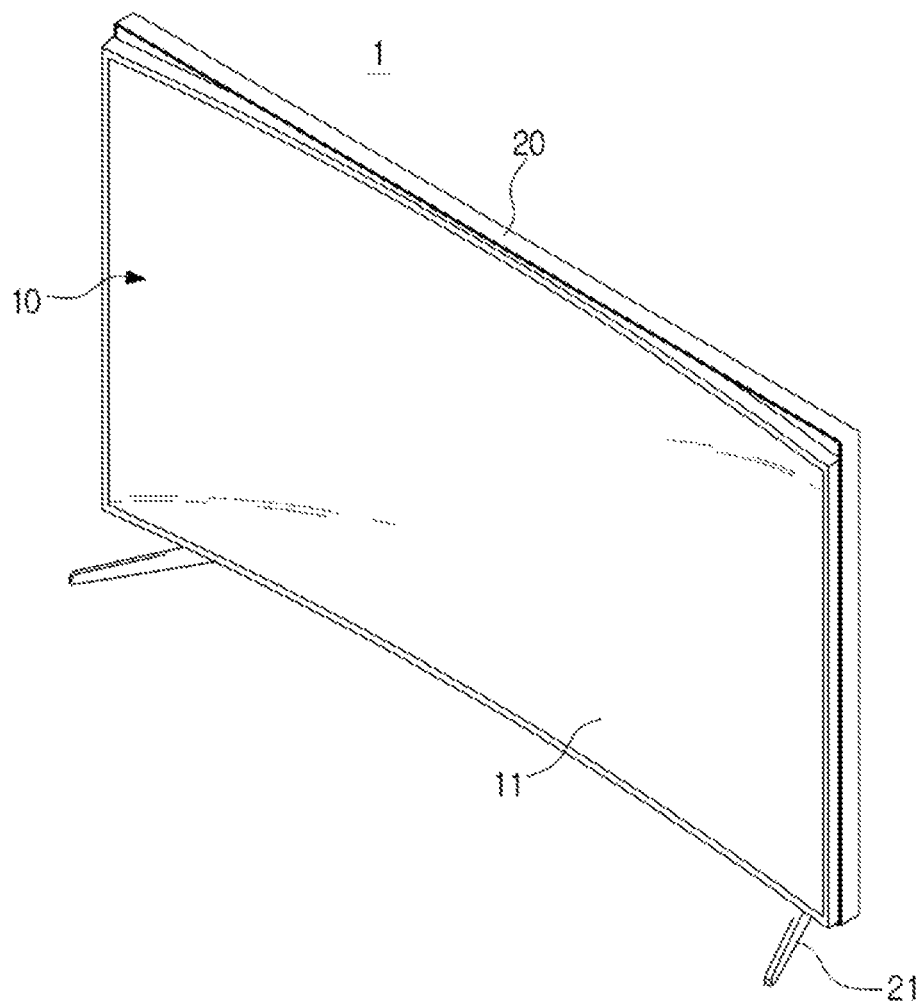
FIG. 2 is a perspective view illustrating a display module of a display apparatus according to an exemplary embodiment, which is set in a curved surface state.

As shown in FIGS. 1 and 2, a display apparatus 1 includes a display module 10 that is provided to be deformable. The display module 10 may have both ends thereof protruding forward beyond the center thereof. The display module 10 may be switchable between a flat surface state and a curved surface state in which both ends of the display module 10 protrude forward to form a predetermined curvature.

The display apparatus 1 includes the display module 10 to display image information and a rear case 20 disposed outside the display module 10 to protect the display module 10 and internal electronic components.

The rear case 20 may be arranged to surround the display module 10 at the back of the display module 10. The rear case 20 may include a stand 21 that is detachably installed, and configured to install the display apparatus 1 in an upright position.

Although not shown in the drawing, the display apparatus 1 according to an exemplary embodiment may be fixed to a wall by using a wall-type bracket instead of using the stand 21. In this case, the wall-type bracket may be detachably installed on the rear case 20, or detachably installed on a base member by passing through the rear case.

A power supply to supply power necessary for driving of the display module 10 may be provided inside the rear case 20.

Meanwhile, the display module 10 may include a self-emission type display device configured to emit light by electrically exciting a fluorescent organic compound, for example, an organic light emitting diode (OLED), and a light receiving display device requiring an additional light source, for example, a liquid crystal display (LCD).

Figure 3:
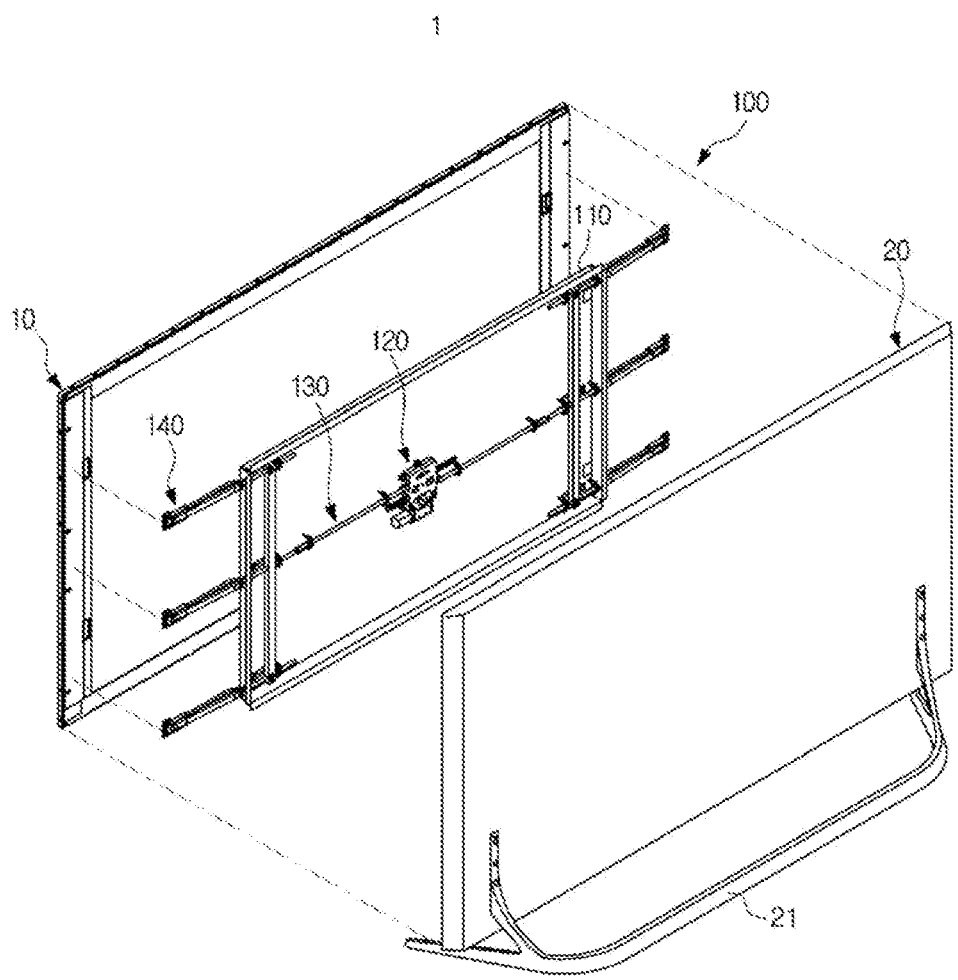
FIG. 3 is an exploded perspective view illustrating a display apparatus according to an exemplary embodiment.
Figure 4:
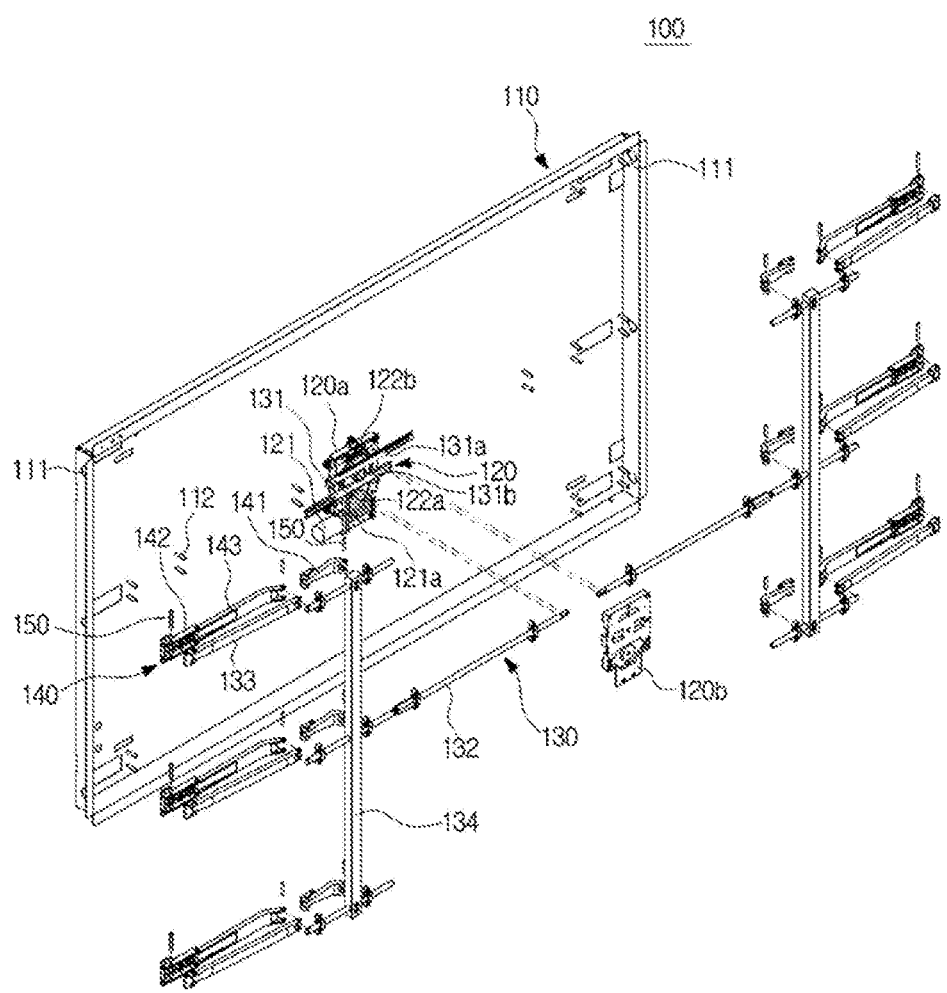
FIG. 4 is an exploded perspective view illustrating a driving apparatus applied to a display apparatus according to an exemplary embodiment.
Figure 5:
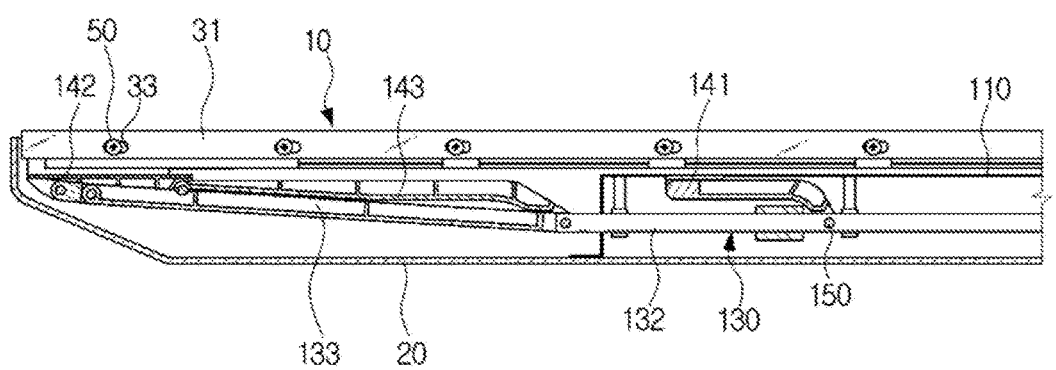
FIGS. 5 and 6 are views illustrating an operation state of a driving apparatus according to an exemplary embodiment.
Figure 6:
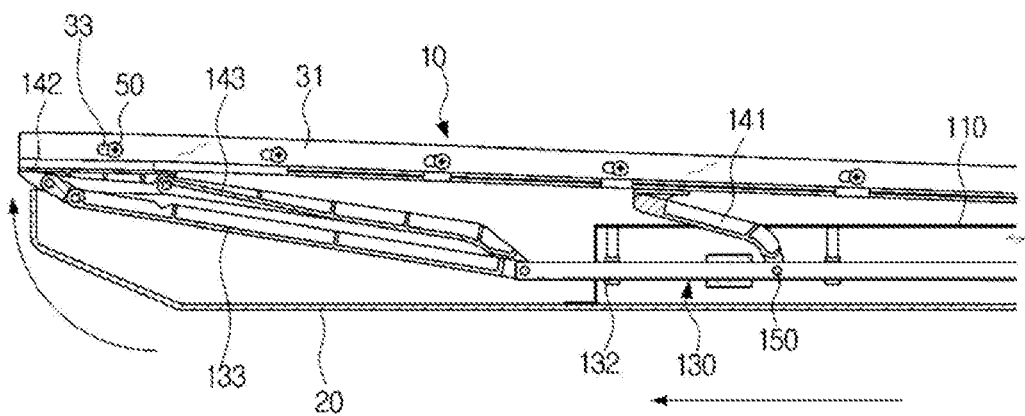
Figure 7:
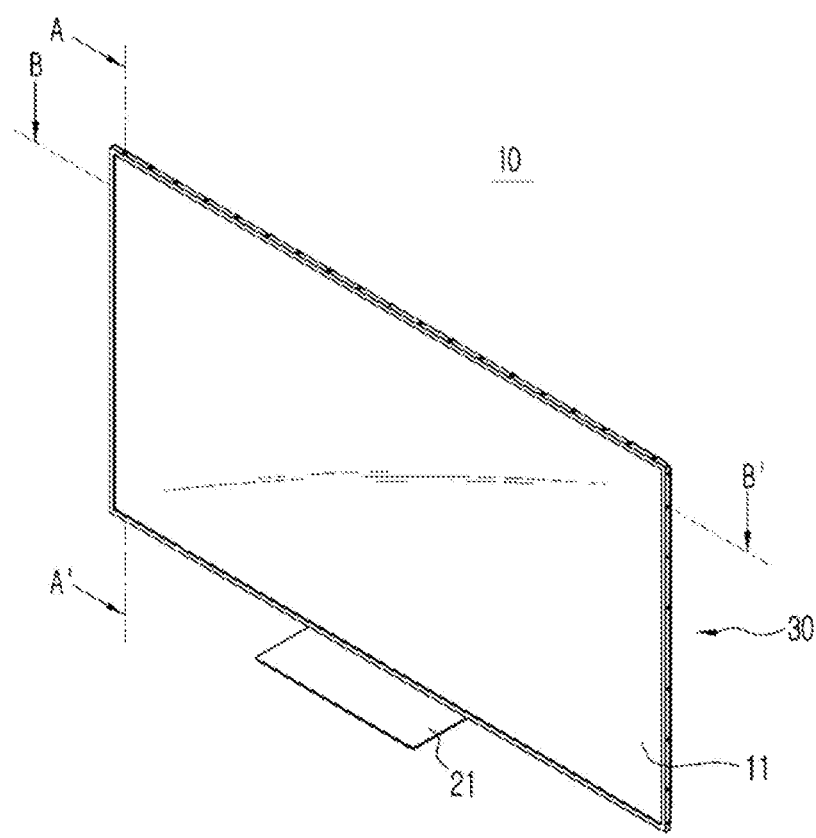
FIG. 7 is a perspective view schematically illustrating a display module of a display apparatus according to an exemplary embodiment.
Figure 8:
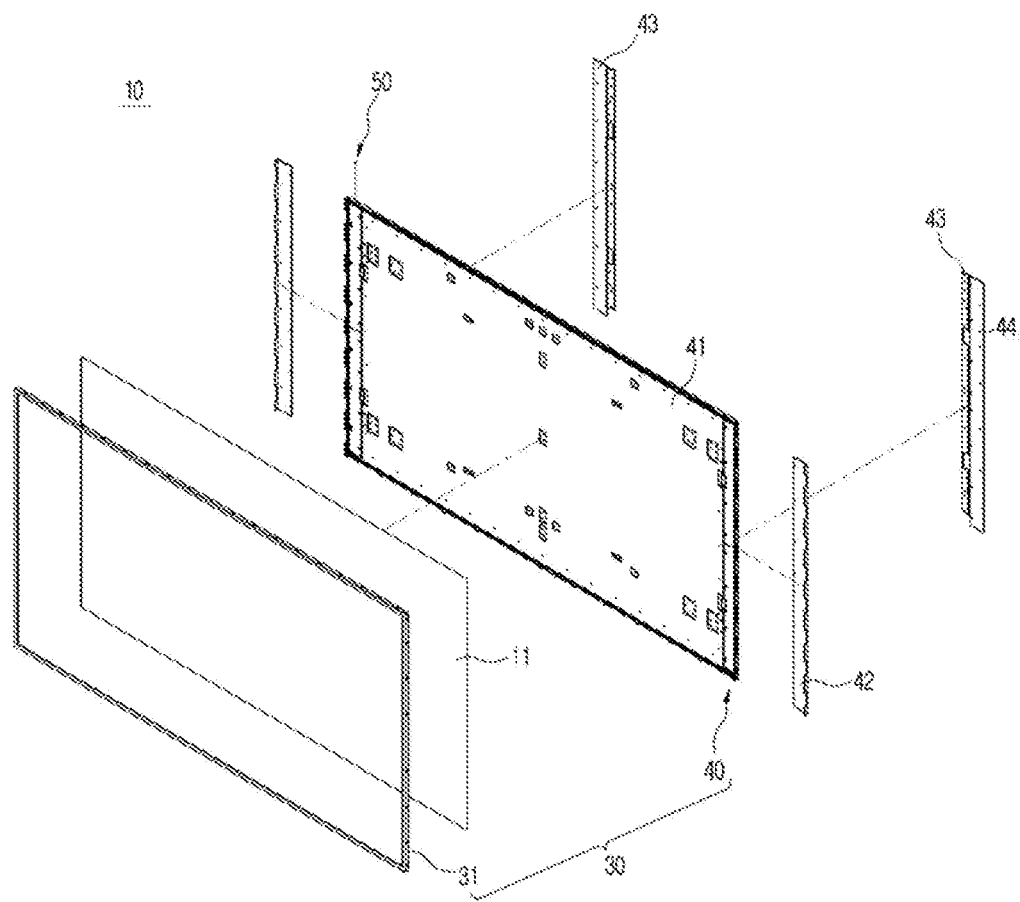
FIG. 8 is an exploded perspective view schematically illustrating a display module according to an exemplary embodiment.

In addition, a driving apparatus 100 (shown in FIG. 3) may be provided between the display module 10 and the rear case 20 to switch the display module 10 into a flat surface state or a curved surface state.

Referring to FIGS. 3 to 6, the driving apparatus 100 of the display module 10 includes a driver 120 to generate a driving force, a plurality of moving members 130 moved by receiving a driving force from the driver 120, and a plurality of rotating members 140 rotatably connected to the moving member 130.

The driving apparatus 100 includes a base member 110 provided at a back of the display module 10. The base member 110 is disposed to support the display module 10 at the back of the display module 10 when the display module 10 is switched from the flat surface state into the curved surface state.

The driver 120 is positioned at the center of the base member 110 such that both sides of the display module 10 are symmetrically deformed. That is, the driver 120 is positioned at the center portion of the back of the display module 10 such that distances from the driver 120 to both sides are substantially the same, and thus the driving force generated from the driver 120 is equally transmitted to the both sides of the display module 10. Accordingly, both ends of the display module 10 are symmetrically deformed by the driver 120.

The driver 120 is fixed to a rear surface of the base member 110 such that the display module 10 is switched from a flat surface state into a curved surface state, or switched from a curved surface state into a flat surface state based on the base member 110.

The base member 110 may be provided with a plurality of installation ports 111 (FIG. 4) perforated through a lateral side of the base member 110 such that moving members 130 are installed, and a plurality of link guides 112 to guide movement of the moving members 130.

The driver 120 includes a driver case 120a fixed to the base member 110, a motor 121 generating a driving force, a gear 122a and 122b connected to the motor 121, and a driver cover 120b surrounding the outside of the fixed driver case 120a.

Although the description in the specification will be made in relation that the motor 121 according to an exemplary embodiment is disposed outside the driver case 120a, and the gear 122a and 122b is disposed inside the driver case 120a as an example, an aspect of an exemplary embodiment is not limited thereto. For example, the motor and the gear may be located inside the driver case and the driver cover.

Meanwhile, the gear 122a and 122b of the driver 120 includes a first gear 122a rotating by being connected to a worm gear 121a of the motor 121, and a second gear 122b rotating by being connected to the first gear 122a, the second gear 122b being connected to the moving members 130.

The moving members 130 are provided to linearly move in a widthwise direction of the display module 10 by receiving a driving force from the motor 121 of the driver 120.

The moving members 130 include a first link 131 connected to the driver 120, a second link 132 connected to the first link 131, third links 133 connected to the second link 132, and a connecting link 134 provided between the second link 132 and the third links 133.

The first link 131 is connected to the second gear 122b of the driver 120.

In this case, in an exemplary embodiment, the first link 131 may be provided as a pair of first links 131a and 131b to be horizontally connected to an upper end and a lower end of the second gear 122*b*. The pair of first links 131*a* and 131*b* move in a direction opposite to each other when the second gear 122*b* rotates.

The second link 132 is laterally connected to one end portion of the first link 131.

The connecting link 134 is provided in a lengthwise direction of the display module 10. The connecting link 134 is vertically connected with respect to the second link 132.

The third links 133 are connected to an upper end, a lower end, and the center of the connecting link 134. Although the third links 133 according to an exemplary embodiment are illustrated as being connected to an upper end, a lower end, and a center of the connecting link 134 as an example, an exemplary embodiment is not limited thereto. For example, the third link 133 may be formed in various ways depending on the size and shape of the display module.

The third link 133 is connected to the connecting link 134 to receive a driving force of the driver 120, which is delivered through the first link 131 and the second link 132, thereby moving in a horizontal direction.

Meanwhile, the first link 131, the second link 132, the third link 133, and the connecting link 134 of the moving members 130 are rotatably connected to each other by hinges 150.

The rotating members 140 include a first rotating part 141 rotatably connected to the second link 132 to support movement of the center portion of the display module 10, a second rotating part 142 rotatably connected to the third link 133 to support movement of the side portion of the display module 10, and a rotary link 143 connected to the second rotating part 142 so as to rotate between the hinges 150 of the second link 132 and the third link 133.

The rotating members 140 are installed to be rotated between the moving members 130 and the display module 10, and by rotating in linkage with the movement of the moving members 130, the display module 10 made bendable. The first rotating part 141 and the second rotating part 142 move while being spaced apart from each other, and are simultaneously rotated in linkage with the movement of the moving members 130.

To this end, one end of the first rotating part 141 is connected to the second link 132, and the other end of the first rotating part 141 is rotatably connected to the display module 10. In addition, one end of the second rotating part 142 is rotatably connected to the third link 133 of the moving member 130 and to a rear side of the display module 10, and the other end of the second rotating part 142 is rotatably connected to the rotary link 143.

Accordingly, in an exemplary embodiment, when the motor 121 of the driver 120 rotates, the gear 122*a* and 122*b* is rotated, and according to rotation of the gear 122*a* and 122*b*, the first link 131 linearly moves in both directions. At the same time of the movement of the first link 131, the second link 132, and the third link 133 are moved, and the first rotating part 141 and the second rotating part 142 connected to the second link 132 and the third link 133, respectively, are rotated to press the display module 10 provided at a front of the first rotating part 141 and the second rotating part 421, thereby allowing both ends of the display module 10 to move forward.

In this case, in an exemplary embodiment, the second gear 122*b* of the driver 120 includes a pinion provided to be rotated by the motor 121, and the first link 131 includes a rack gear 131*a* that horizontally moves to opposite directions according to rotation of the pinion.

As described above, both side ends of the display module 10 are moved by the driving apparatus 100 forward beyond the center portion of the display module 10, so that the display module 10 forms a curved surface state.

Referring to FIGS. 7 to 18, the display module 10 provided to be switchable between a curved surface state and a flat surface state for example as above, according to an exemplary embodiment. The display module 10 includes a display panel 11 provided with a liquid crystal panel and a frame 30 arranged at the back of the display panel 11.

The frame 30 includes a first frame 31 arranged at the front side of the display panel 11 to form an edge and a second frame 40 arranged at the rear side of the display panel 11 to form a rear surface.

In addition, the display module 10 may include a backlight unit 14 disposed at the back of the display panel 11 and spaced apart from the display panel 11 to emit light to the display panel 11.

The backlight unit 14 includes a plurality of optical sheets (not shown) disposed at a lower portion of the display panel 11, a light guide plate 13 positioned at a lower portion of the optical sheets, and a light emitting diode 14*b* to supply light to the light guide plate 13.

Figure 11:
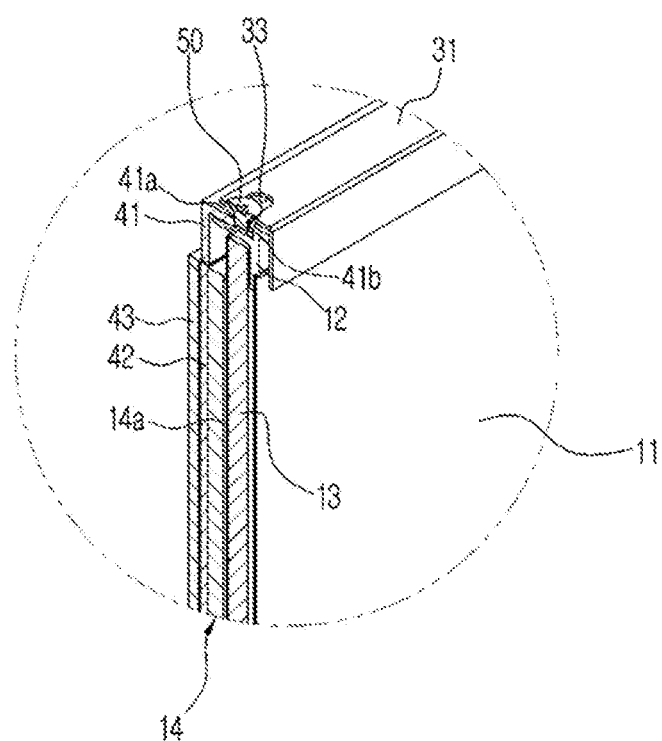
FIG. 11 is a cross-sectional view taken along line A-A' of FIG. 7 according to an exemplary embodiment.
Figure 12:
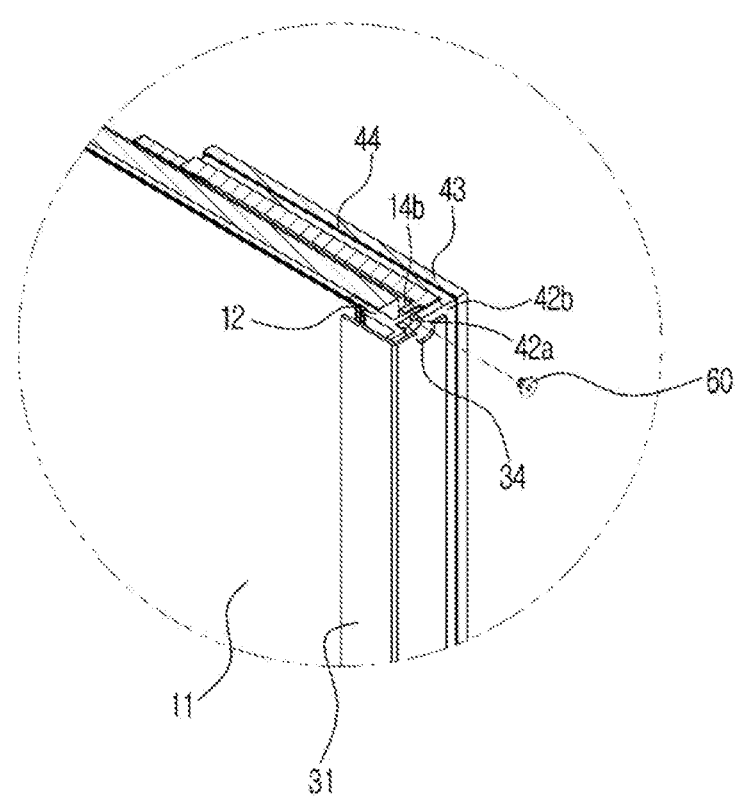
FIG. 12 is a cross-sectional view taken along line B-B' of FIG. 7 according to an exemplary embodiment.

Referring to FIG. 11, according to an exemplary embodiment, the light guide plate is disposed at the back of the display panel 11, and the light emitting diode is disposed at the side of the light guide plate to emit light toward a side end of the light guide plate. However, the configuration of the light guide plate is not limited thereto, and according to another exemplary embodiment, the light guide plate may be installed to face a rear surface of the display panel 11 to directly emit light onto the rear surface of the display panel 11.

Meanwhile, in the case that the display module 10 is provided with a liquid crystal panel for the display panel 11, the backlight unit is included in the display module 10, and accordingly the display module 10 inevitably has a thickness greater than or equal to a certain value.

Accordingly, when the display module 10 is deformed, the first frame 31 forming the front of the display module 10 needs to be deformed to have a curvature greater than the curvature of the second frame 40 forming the back of the display module 10.

The second frame 40 may include a first bracket 41 arranged to support the rear surface of the display panel 11 and a second bracket 42 arranged to be slidable from the first bracket 41 in both leftward and rightward directions.

The first bracket 41 is arranged to support the rear surface of the display panel 11, and the second bracket 42 is arranged to be slidable from both ends of the first bracket 41.

The first bracket 41 includes a cover 43 allowing sliding movement of the second bracket 42. The cover 43 includes a guide 44 formed on the inner surface of the cover 43 to allow movement of the second bracket 42.

Accordingly, when the second bracket 42 is installed, it is allowed to slide to the outside of the first bracket 41 by the guide 44 of the cover 43.

Meanwhile, a plurality of fastening holes 33 and a plurality of fixing holes 34 are formed in the first frame 31 to allow the first frame 31 to be connected with the second frame 40.

The fastening holes 33 may be formed in the upper surface and lower surface of the first frame 31 to correspond to each other and positioned to be spaced at a predetermined distance from each other. The fixing holes 34 may be formed in the both lateral surfaces of the first frame 31 to correspond to each other and positioned to be spaced at a predetermined distance from each other.

The fastening holes 33 of the first frame 41 may be coupled with the first bracket 41 of the second frame 40 by connecting members 50.

The connecting member 50 allows the first frame 31 and the second frame 40 to move relative to each other.

The fixing holes 34 may be coupled with the second bracket 42 of the second frame 40 by fixing members 60.

The first bracket 41 of the second frame 40 may be provided with screw connecting recesses 41a corresponding to the fastening holes 33 of the first bracket 41, and the second bracket 42 may be provided with screw fixing recesses 42a corresponding to the fixing holes 34 of the second bracket 42.

The fastening holes 33 may be provided with long holes extending in the lateral direction of the display module 10.

In addition, the connecting members 50 may connect the first frame 31 and the first bracket 41 of the second frame 40 through the fastening holes 33 such that the first frame 31 and the second frame 40 move relative to each other.

Figure 10:
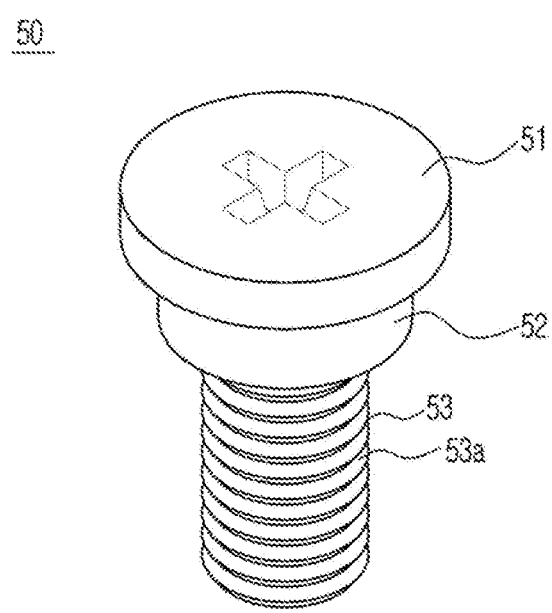
FIG. 10 is a perspective view schematically illustrating a connecting member according to an exemplary embodiment.

According to an exemplary embodiment, as shown in FIG. 10, the connecting member 50 may include a head 51 provided with a recess 51a for fastening and rotation, a first support 52 integrally formed at the lower end of the head 51, and a second support 53 extending from the lower end of the first support 52 and provided with threads 53a on the outer circumferential surface thereof.

The first support 52 may have a smaller diameter than the head 51. The first support 52 has an outer circumferential surface thereof formed in a cylindrical shape to allow the first support 52 to slidably move relative to the fastening hole 33.

The screw connecting recesses 41a of the first bracket 41 may be provided with threads 41b corresponding to the threads 53a to allow the second support 53 of the connecting members 50 to be fixed to the first bracket 41 of the second frame 40.

Accordingly, the first support 52 of the connecting member 50 is movable to the fastening hole 33 of the first frame 31 when it is fastened, and the second support 53 is securely fastened to the screw connecting recess 41a formed at the first bracket 41 of the second frame 40.

Figure 9:
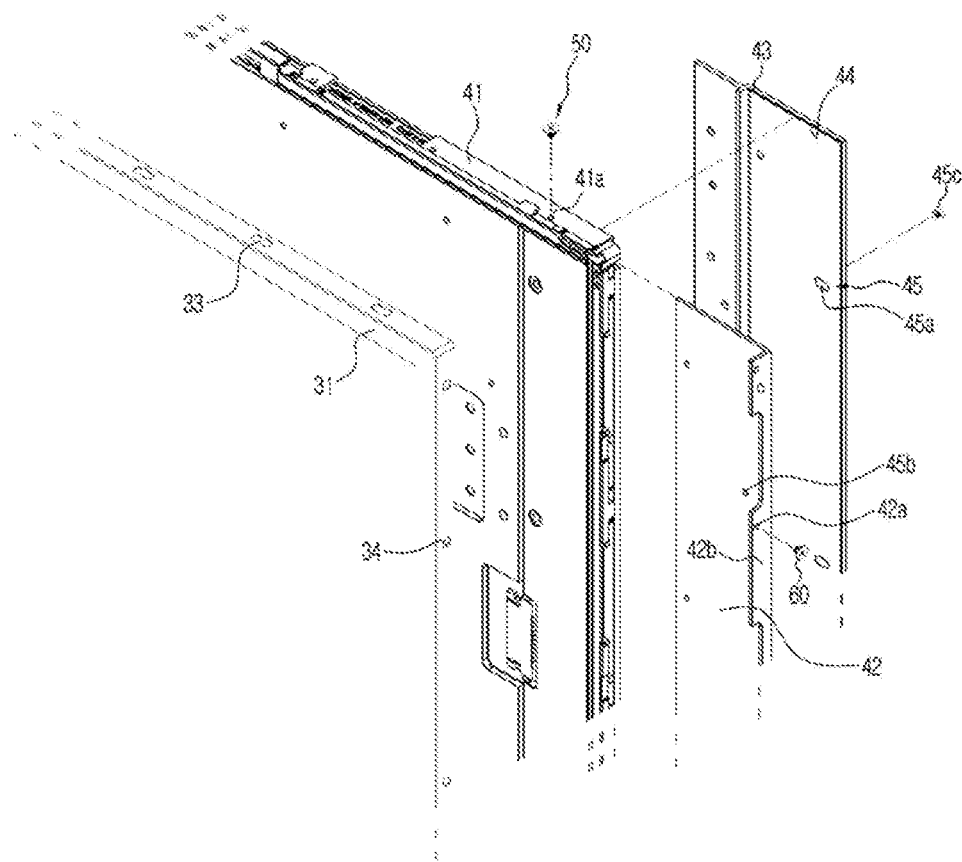
FIG. 9 is a partially enlarged view illustrating a display module according to an exemplary embodiment.

The fixing holes 34 formed in both lateral surfaces of the first frame 31 may be fixed to the screw fixing recesses 42a formed at the second bracket 42 of the second frame 40 by the fixing members 60 (shown in FIGS. 9 and 11).

At this time, the screw fixing recesses 42a may be formed at a lateral surface portion 42b formed at the side end of the second bracket 42 by being bent forward.

Accordingly, in an exemplary embodiment, when the display module 10 is switched to the curved surface state, the first frame 31 and the second bracket 42 of the second frame 40 which are fixed by the fixing members 60 may move together with the first frame 31.

To this end, referring to FIG. 9, the second bracket 42 may be coupled to a slide 45 to slide to the cover 43. The slide 45 may include a sliding slot 45a formed in the cover 43, a slide fixing hole 45b formed in the second bracket 42 to correspond to the sliding slot 45a, and a slide screw 45c coupled with the sliding slot 45a through the slide fixing hole 45b.

The sliding slot 45a may be formed as a long hole to allow the slide screw 45c to be coupled thereto.

The slide screw 45c may include a head 51 provided with a recess for fastening and rotation, a first support 52 integrally formed at the lower end of the head 51, and a second support 53 extending from the lower end of the first support 52 and provided with threads 53a on the outer circumferential surface thereof.

The sliding screw 45c may include the connecting member 50 allowing the cover 43 to move relative to the second bracket 42.

The sliding screw 45c is fixed to the slide fixing hole 45b of the second bracket 42 by passing through the sliding slot 45a.

Accordingly, the sliding screw 45c moves in linkage with movement of the second bracket 42. In this case, the sliding screw 45c may be guided by the sliding slot 45a.

Figure 13:
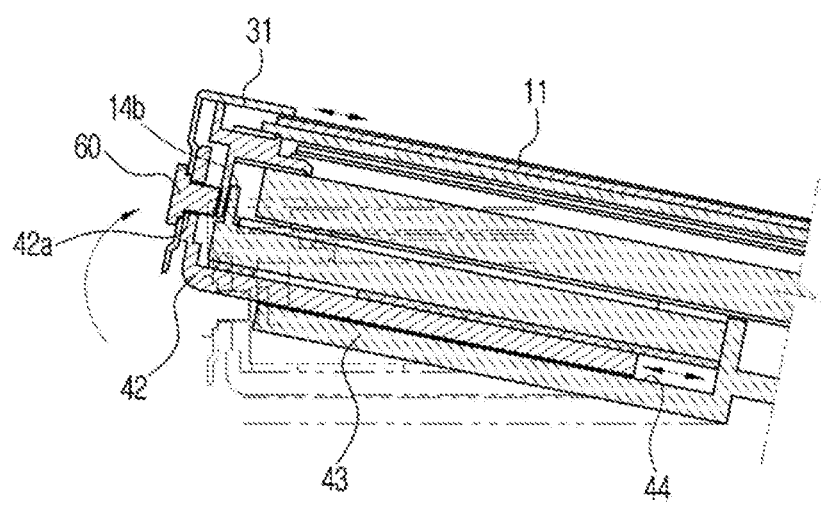
FIG. 13 is a view schematically illustrating movement of a frame of a display module to the flat surface state and the curved surface state according to an exemplary embodiment.
Figure 14:
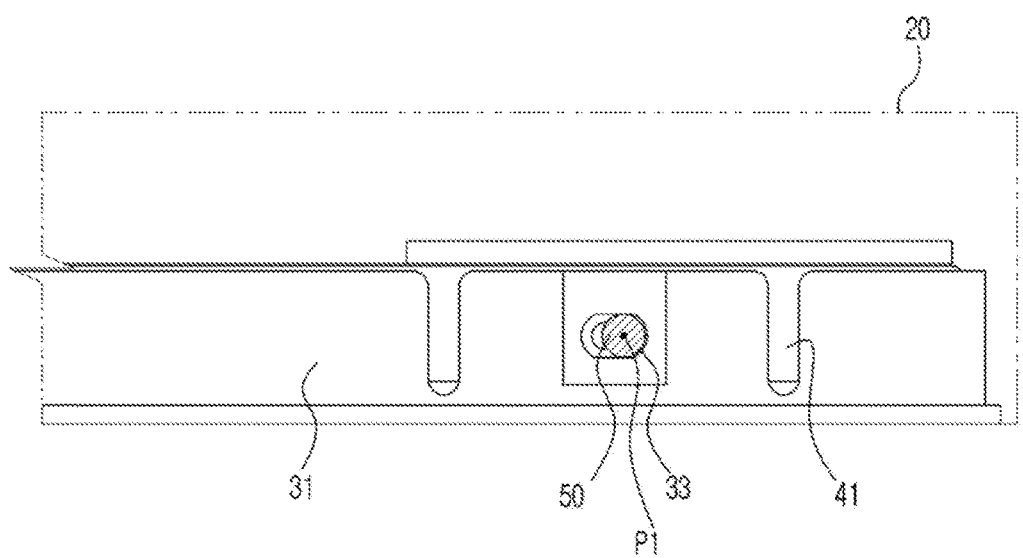
FIG. 14 is a view schematically illustrating a first frame and a second frame with a display module set in the flat surface state according to an exemplary embodiment.
Figure 15:
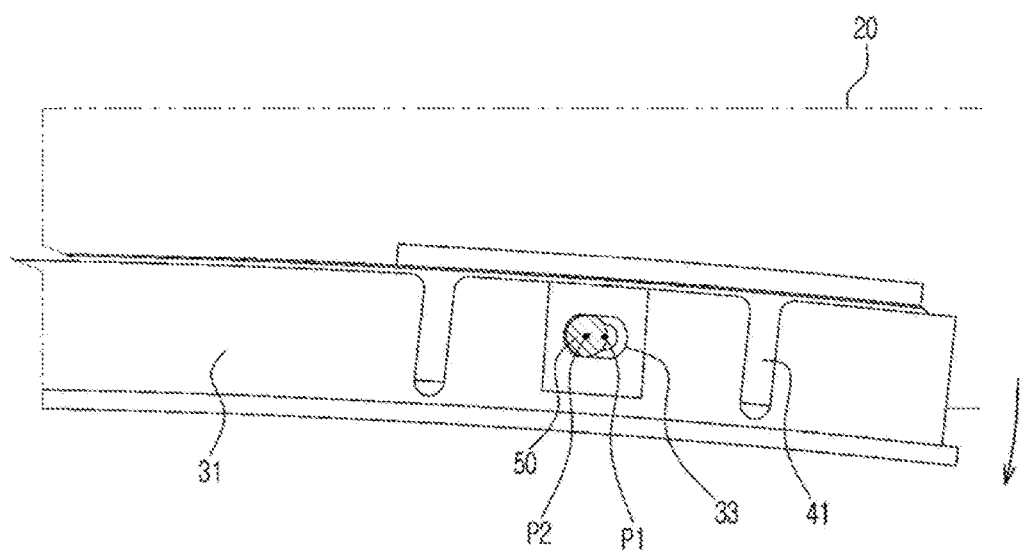
FIG. 15 is a view schematically illustrating a first frame and a second frame with a display module set in the curved surface state according to an exemplary embodiment.

As shown in FIGS. 13 to 15, according to an exemplary embodiment, when the display apparatus 1 is switched between the flat surface state and the curved surface state, a difference D is produced between the first frame 31 forming a part of the front surface of the display module 10 and the second frame 40 forming a part of the rear surface of the display module 10 due to a relative movement of the first frame 31 and the second frame 40.

When the display apparatus 1 is in the flat surface state, the length of the first frame 31 of the display module 10 is equal to that of the second frame 40.

However, when the display apparatus 1 is switched to the curved surface state, both ends of the first frame 31 forming the front part of the display module 10 move forward further than both ends of the second frame 41 move forward.

Accordingly, the difference depends on the surface position of the display module 10 of the display apparatus 1 according to an exemplary embodiment.

In addition, in the flat surface state of the display module 10, the connecting members 50 and fixing members 60 arranged on the lateral surface to connect the first frame 31 and the second frame 40 remain stationary at the original positions thereof.

At this time, the connecting member 50 is located at a first position P1 in the fastening hole 33 of the first frame 31, as shown in FIG. 14, according to an exemplary embodiment.

When the display module 10 is switched to the curved surface state, the second bracket 42 of the second frame 40 connected with the first frame 31 by the fixing members 60 slides along the first frame 31.

At this time, the connecting member 50 move to a second position P2 in the fastening hole 33 of the first frame 31, as shown in FIG. 15, according to an exemplary embodiment.

Both ends of the second frame 40 and the first frame 31 may be moved by the connecting member 50 as well as the sliding of the second bracket 42 and thus the first frame 31 at the front of the display module 10 and the second frame 40 at the back of the display module 10 may be smoothly deformed.

Such a smooth deformation and bending may prevent the display module 10 from being damaged.

Figure 16:
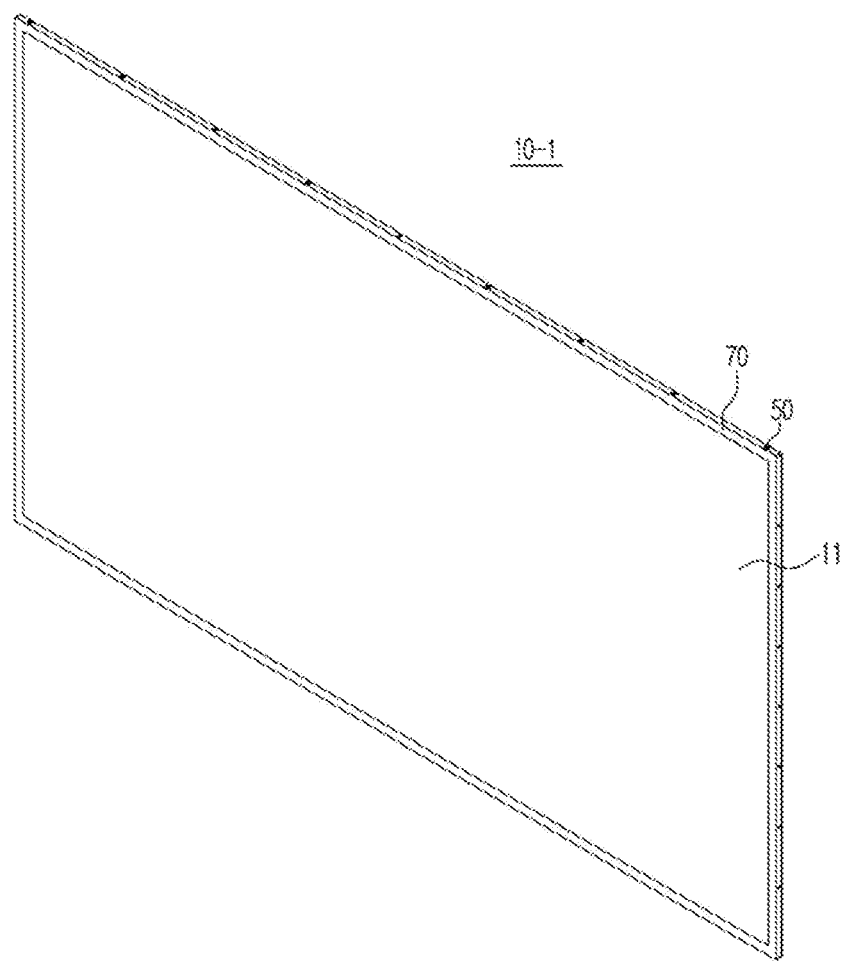
FIG. 16 is a view schematically illustrating a display module according to another exemplary embodiment.
Figure 17:
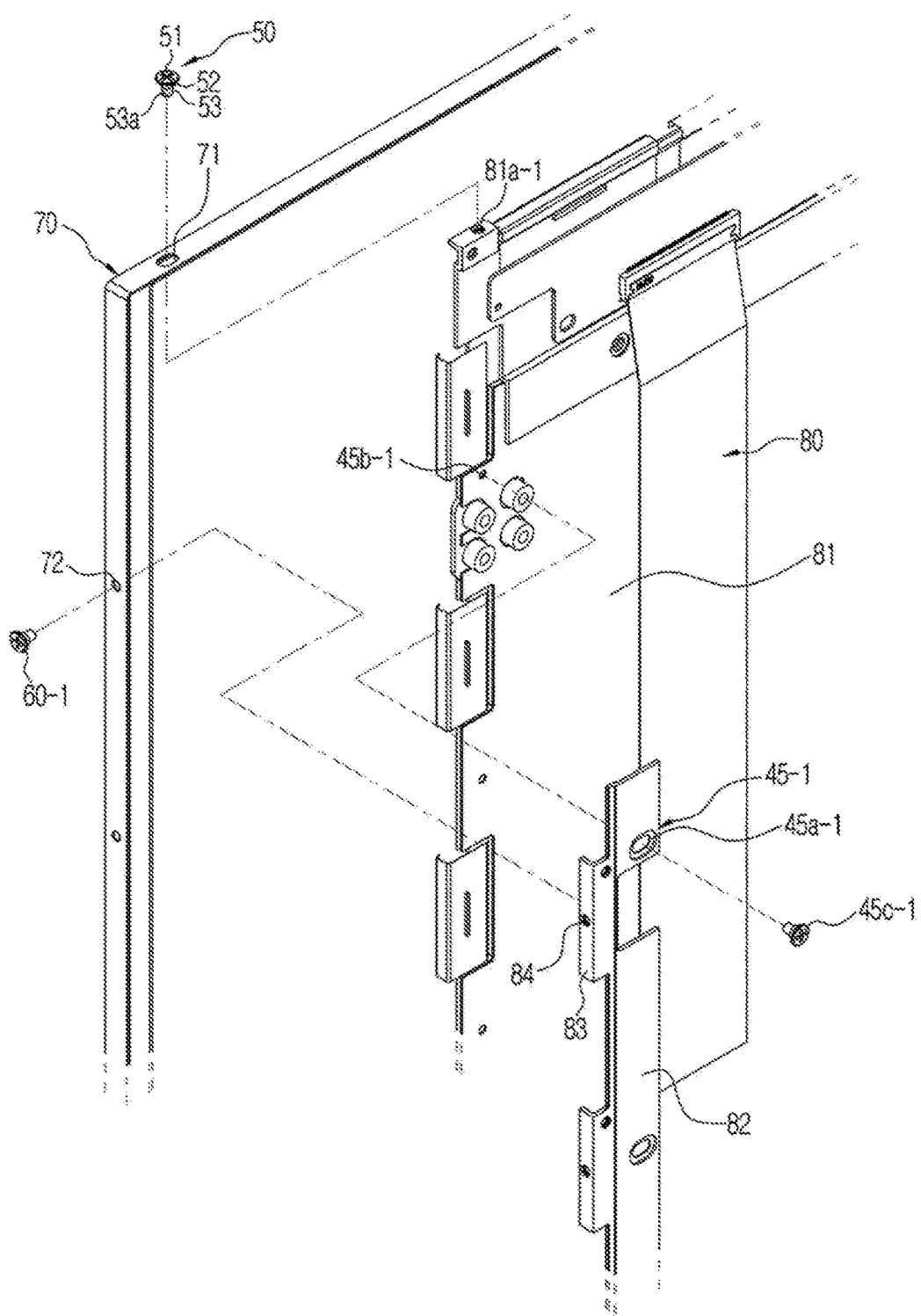
FIG. 17 is an exploded perspective view schematically illustrating a top chassis and bottom chassis of a display module according to another exemplary embodiment.
Figure 18:
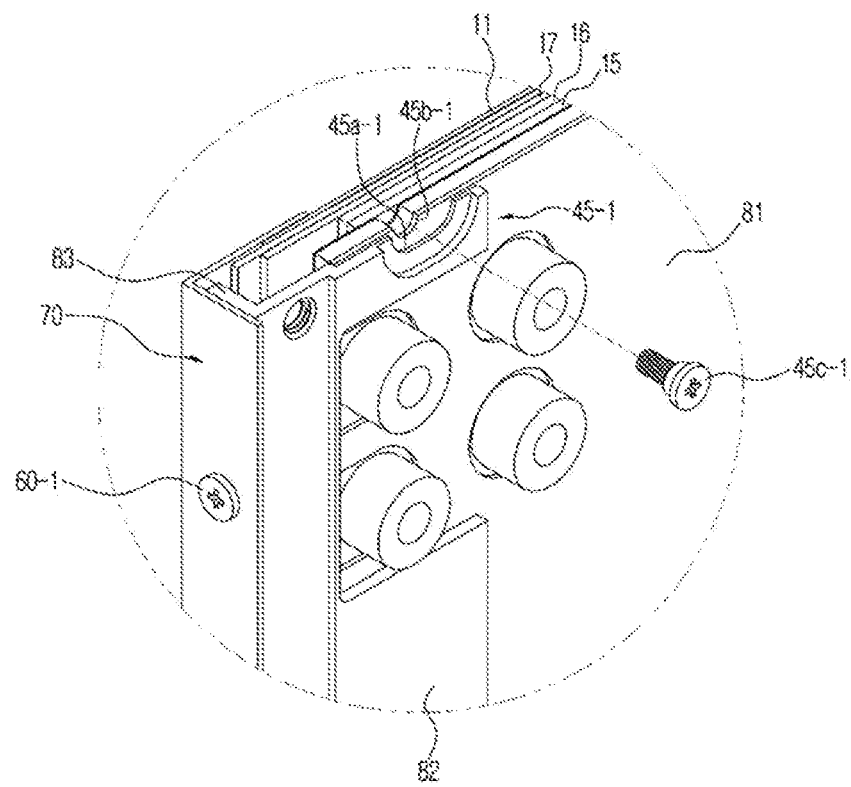
FIG. 18 is a cross-sectional view schematically illustrating a slide part of a top chassis and bottom chassis of a display module according to another exemplary embodiment.

As shown in FIGS. 16 to 18, according to an exemplary embodiment, the display module 10-1 adapted to display images includes a display panel 11 to display images, a bottom chassis 80 to support the rear surface of the display panel 11, and a top chassis 70 to cover the outer edge of the front surface of the display panel 11.

The display panel 11 is constructed with an organic light emitting diode panel. Since the organic light emitting diode panel is in the form of a flexible film, the display panel 11 may be easily bent.

The top chassis 70 may support the outer edge of the front surface of the display panel 11 to maintain the display panel 11 at a position on the bottom chassis 80 where it is installed.

Herein, the bottom chassis 80 and the top chassis 70 are bendable. In addition, a heat dissipation sheet 17 allowing heat generated in the display panel 11 to be quickly dissipated, a thermal insulation sheet formed of an insulating material and disposed between the heat dissipation sheet 17 and the bottom chassis 80 to prevent the heat generated in the display panel 11 from being transferred rearward, and a reinforcement member 15 to increase strength of the bottom chassis 80 may be installed on the rear surface of the display panel 11.

The heat dissipation sheet 17 and the thermal insulation sheet 16 may be positioned between the reinforcement member 15 and the display panel 11.

The bottom chassis 80 includes a first bottom chassis 81 to support the rear surface of the display panel 11 and a second bottom chassis 82 installed to slide in a lateral direction of the display panel 11.

The first bottom chassis 81 is fixed to support the rear surface of the display panel 11, and the second bottom chassis 82 is arranged to slide from both lateral ends of the first bottom chassis 81.

When the display module 10-1 is switched to the curved surface state, both lateral ends of the top chassis 70 move forward relative to the central portion of the top chassis 70.

The top chassis 70 may be slidable to the first bottom chassis 81. At this time, the upper surface and lower surface of the top chassis 70 are provided with at least one fastening hole 71 allowing the top chassis 70 to be fastened to the first bottom chassis 81.

Herein, the fastening hole 71 may be a long hole extending in the longitudinal direction of the display module 10-1 to allow the top chassis 70 to be coupled thereto by a connecting member 50 and movable forward.

The connecting member 50 may include a head 51 provided with a recess for fastening and rotation, a first support 52 integrally formed at the lower end of the head 51, and a second support 53 extending from the lower end of the first support 52 and provided with threads 53a on the outer circumferential surface thereof.

The first support 52 may have a smaller diameter than the head 51, and has an outer circumferential surface thereof formed in a cylindrical shape to allow the first support 52 to slide to the fastening hole 71.

The fastening hole 71 may be formed to correspond to the first support 52 of the connecting member 50, and the connecting member 50 may be coupled to be movable within the long hole.

A screw connecting hole 81a-1 corresponding to the fastening hole 71 of the top chassis 70 is formed in the upper surface and lower surface of the first bottom chassis 81. The screw connecting hole 81a-1 is provided with threads (not shown) to correspond to the second support 53 of the connecting member 50. Thereby, the screw connecting hole 81a-1 fixes the top chassis 70 and the first bottom chassis 81.

In addition, both lateral surfaces of the top chassis 70 may be provided with at least one fixing hole 72 to fix the top chassis 70 to the second bottom chassis 82.

The second bottom chassis 82 includes a lateral surface portion 83 having both lateral ends bent forward.

The lateral surface portion 83 may be provided with a screw fixing hole 84 corresponding to the fixing hole 72.

Accordingly, when the top chassis 70 is bent such that both lateral ends of the top chassis 70 move forward, the second bottom chassis 82 fixed to the top chassis 70 may also move together with the top chassis 70.

At this time, the top chassis 70 is fixed to the second bottom chassis 82 by a fixing member 60-1. The fixing member 60-1 fixes the top chassis 70 and the second bottom chassis 82 through the screw connecting hole 81a-1 of the top chassis 70 and the screw fixing hole 84 of the second bottom chassis 82.

Meanwhile, the first bottom chassis 81 is coupled to the second bottom chassis 82 by a slide 45-1 such that the first bottom chassis 81 and the second bottom chassis 82 move relative to each other.

The second bottom chassis 82 is coupled to the first bottom chassis 81 by a sliding screw 45c-1 so as to be movable relative to the first bottom chassis 81. The slide 45-1 may include a sliding slot 45a-1 formed in the second bottom chassis 82, a slide fixing hole 45b-1 formed in the first bottom chassis 81 to correspond to the sliding slot 45a-1, and the slide screw 45c-1 coupled with the sliding slot 45a-1 through the slide fixing hole 45b-1.

The sliding slot 45a-1 may be formed as a long hole to allow the slide screw 45c-1 to be coupled thereto.

The slide screw 45c-1 may include the connecting member 50 including the head 51 provided with a recess for fastening and rotation, the first support 52 integrally formed at the lower end of the head 51, and the second support 53 extending from the lower end of the first support 52 and provided with threads 53a on the outer circumferential surface thereof.

The slide screw 45c-1, which is inserted into the sliding slot 45a-1 of the second bottom chassis 82 and the slide fixing hole 45b-1 of the first bottom chassis 81 to be fixed, allows the second bottom chassis 82 to move along the sliding slot 45a-1.

Accordingly, in an exemplary embodiment, the lateral ends of the top chassis 70 and the lateral ends of the second bottom chassis 82 may move together and thus the display module 10-1 may be smoothly deformed.

Meanwhile, such a smooth deformation and bending may prevent the display module 10 from being damaged.

To control the bending device, according to an exemplary embodiment, the display apparatus 1 described above may include a controller (not shown), a remote controller (not shown), or a button (not show). Accordingly, by manipulating the button, the display module 10, 10-1 may be switched to one of the flat surface state or the curved surface state.

Alternatively, according to an exemplary embodiment, the display module 10, 10-1 may be automatically switched to the flat surface state or the curved surface state according to the type of content to be displayed on the display module 10, 10-1.

For example, when information indicating that the content to be displayed on the display module 10, 10-1 is news programming is input to the display apparatus 1, the display module 10, 10-1 may be switched to the flat surface state through the bending device. When information indicating that the content to be displayed on the display module 10, 10-1 is a movie is input to the display apparatus 1, the display module 10, 10-1 may be switched to the curved surface state through the bending device.

At this time, information about the type of content may be directly input through the button by the user, or may be received along with an image signal from an image transmitting party such as a broadcast station.

While the display module 10, 10-1 is illustrated as being switched to the flat surface state or the curved surface state at which the display module 10, 10-1 has a certain curvature, exemplary embodiments are not limited thereto. Depending upon selection by the user, the curvature may change continuously or in multiple stages within a certain range. That is, when the user applies pressure to the button, the curvature of the display module 10, 10-1 may continuously change in proportion to the pressing time. Otherwise, the curvature of the display module 10, 10-1 may change in multiple stages in proportion to the number of times the button is pressed.

In addition, according to one or more exemplary embodiments, the entirety of the display is deformed to have a certain curvature. However, exemplary embodiments are not limited thereto. Depending upon design, only the central portion of the display may be deformed with the both lateral ends of the display maintained in the flat surface state, or the central portion and the both lateral ends of the display may be deformed to have different curvatures.

Figure 19:
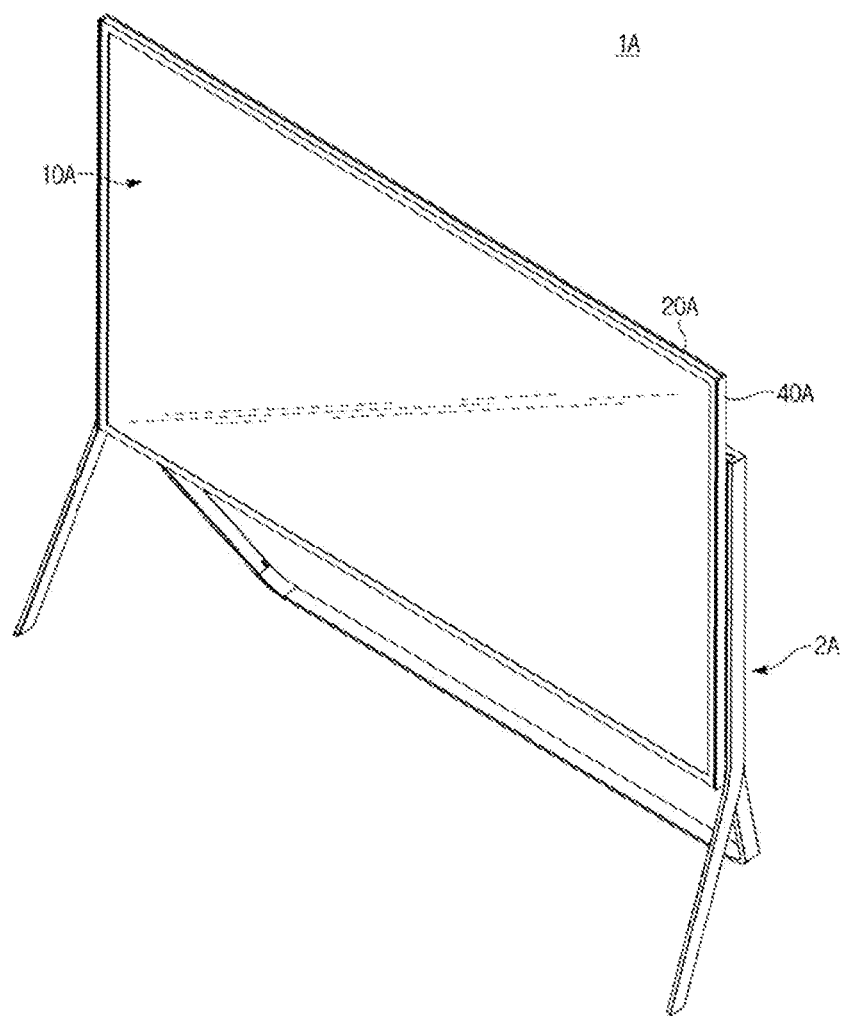
FIG. 19 is a perspective view schematically illustrating a display apparatus according to yet another exemplary embodiment.
Figure 20:
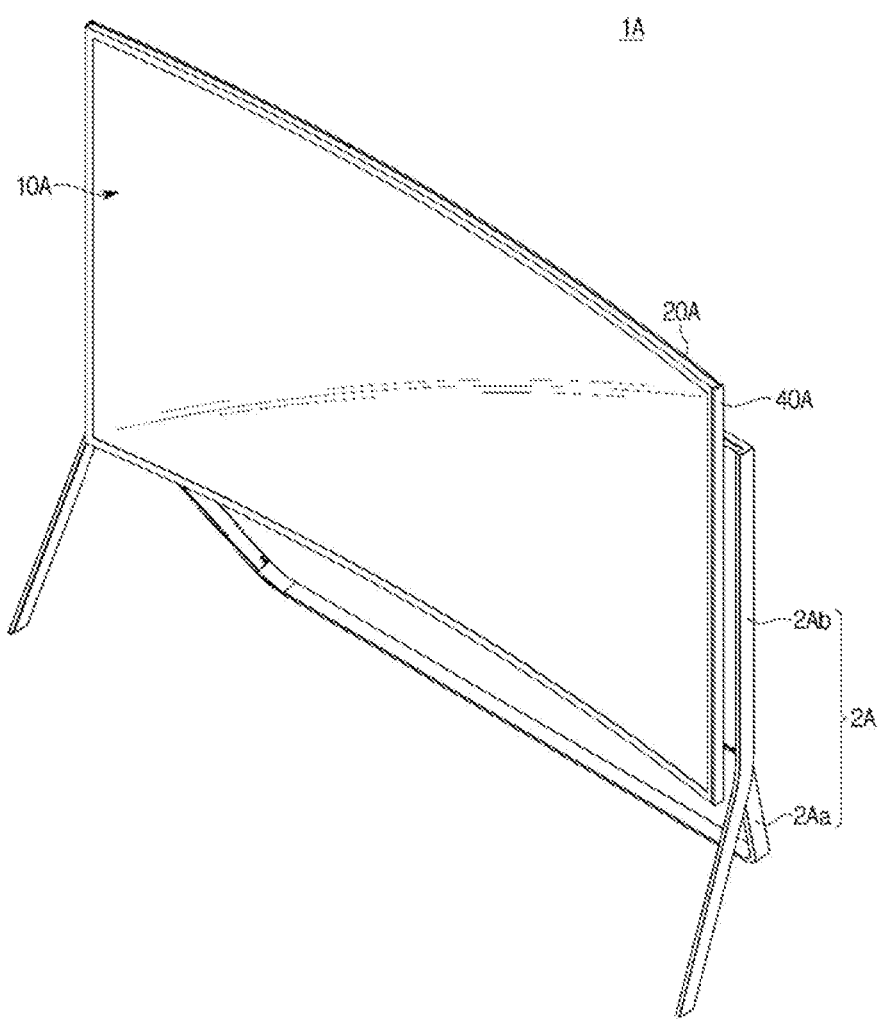
FIG. 20 is a perspective view schematically illustrating a curved surface state of a display apparatus according to yet another exemplary embodiment.
Figure 21:
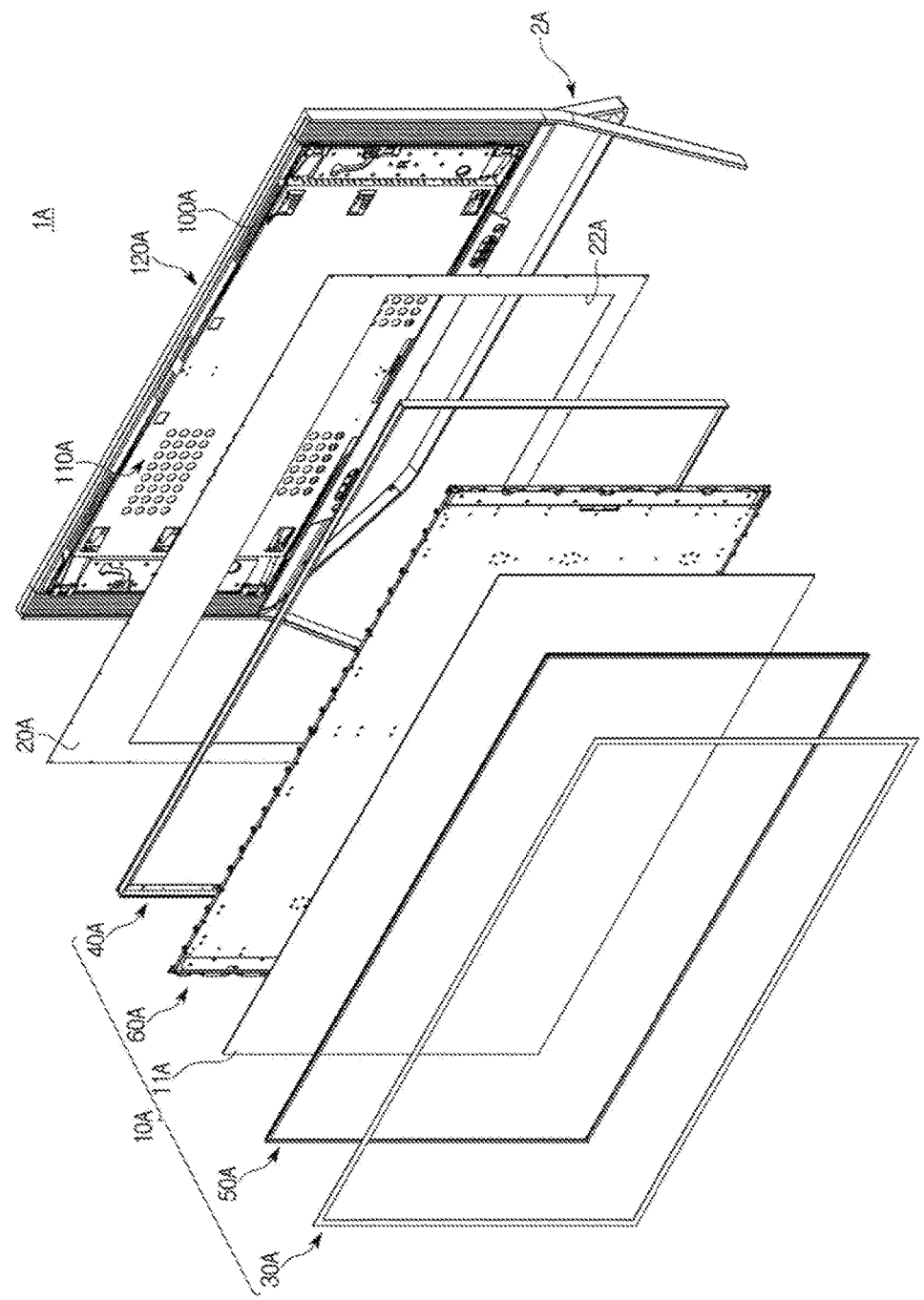
FIG. 21 is an exploded perspective view of a display apparatus according to yet another exemplary embodiment.

FIG. 19 is a perspective view schematically illustrating a display apparatus according to yet another exemplary embodiment. FIG. 20 is a perspective view schematically illustrating a curved surface state of a display apparatus according to yet another exemplary embodiment. FIG. 21 is an exploded perspective view of a display apparatus according to yet another exemplary embodiment.

As illustrated in FIGS. 19 to 26, a display apparatus 1A may include a display module 10A configured to display image information, a side cover 40A provided to form an exterior of the display module 10A when viewed from the side, and a rear cover 20A that is positioned at an outer rear portion of the display module 10A and forms an exterior thereof.

Also, a stand 2A configured to support the display apparatus 1A to be installed on an installation surface such as a bottom in an upright state may be provided. The stand 2A may be detachably connected to the display apparatus 1A.

While one or more of exemplary embodiments show the display apparatus 1A being installed on the installation surface such as a bottom in an upright state by the stand 2A, the scope of exemplary embodiment is not limited thereto. For example, the display apparatus may be installed on the wall using a wall-type member.

Meanwhile, according to an exemplary embodiment, the display apparatus 1A includes the deformable display module 10A. The display module 10A may be in a curved surface state in which both ends thereof protrude forward relative to the center and a flat surface state.

In this case, in an exemplary embodiment, the side cover 40A and the rear cover 20A may be changed to a curved surface state along with the display module 10A.

The side cover 40A forms a side edge of the display module 10A. The rear cover 20A moves along with movement of the side cover 40A at a rear end of the side cover 40A.

The display apparatus 1A may include a deformation apparatus 100A in order to change the display module 10A to the curved surface state or the flat surface state.

The deformation apparatus 100A is provided at a back of the display module 10A and presses both ends of the display module 10A forward to form a curved surface shape in which both ends protrude forward relative to the center portion.

While one or more of exemplary embodiments show the deformation apparatus 100A being positioned lower than the center of a rear surface of the display module 10A, the scope of exemplary embodiments is not limited thereto. For example, the deformation apparatus 100A may be positioned at various different positions at which both ends of the display module 10A can be uniformly deformed.

The deformation apparatus 100A is provided in a base plate 110A that is positioned at the back of the display module 10A. The base plate 110A supports the display module 10A at the back of the display module 10A when the display module 10A is changed from the flat surface state to the curved surface state.

In the rear cover 20A, a deformation apparatus installation port 22A in which the deformation apparatus 100A is installed is formed. The deformation apparatus installation port 22A may be formed below the rear cover 20A in a rectangular shape that is long in a horizontal direction. It is preferable that in an exemplary embodiment, the deformation apparatus installation port 22A be formed in a size and a shape corresponding to the base plate 110A to be described.

Also, the base plate 110A may be fixed to the stand 2A.

For this purpose, in the stand 2A, a holder 2Aa in contact with a bottom and a support 2Ab extending from the holder 2Aa and fixing the base plate 110A may be formed.

The deformation apparatus 100A may include a rear case 120A forming a rear surface thereof. The rear case 120A may be coupled to the base plate 110A and form an exterior of the display apparatus 1A when viewed from the rear.

In this case, according to an exemplary embodiment, forming the rear case 120A of the same color and the same material as the stand 2A provides a sense of unity and beauty.

In an exemplary embodiment, the display module 10A may include a display panel 11A made of a liquid crystal panel and a backlight unit 40A positioned at the back of the display panel 11A and configured to emit light.

The backlight unit 40A to be described, according to an exemplary embodiment, may include a plurality of optical sheets positioned at the back of the display panel 11A, a light guide plate, and a plurality of light emitting diodes configured to supply light to the light guide plate.

While one or more of exemplary embodiments illustrated that, in the backlight unit 40A, the light emitting diode is disposed at the side of the light guide plate and emits light to a side of the light guide plate, exemplary embodiments are not limited thereto. The light emitting diode may be installed to correspond to the rear surface of the display panel and directly emit light onto the rear surface of the display panel.

As described above, the display module 10A including the liquid crystal panel as the display panel 11A has a predetermined thickness due to the backlight unit 40A that is included as a component.

Therefore, when the display module 10A is changed from the flat surface state to the curved surface state, there is a curvature difference between a front surface curvature of the display module 10A and a rear surface curvature of the display module 10A.

In order to compensate for such a curvature difference between the front surface and the rear surface of the display module 10A, a connecting member 500 (FIGS. 22 and 23) configured to move a first frame 50A and a second frame 60A relative to each other may be included.

Figure 22:
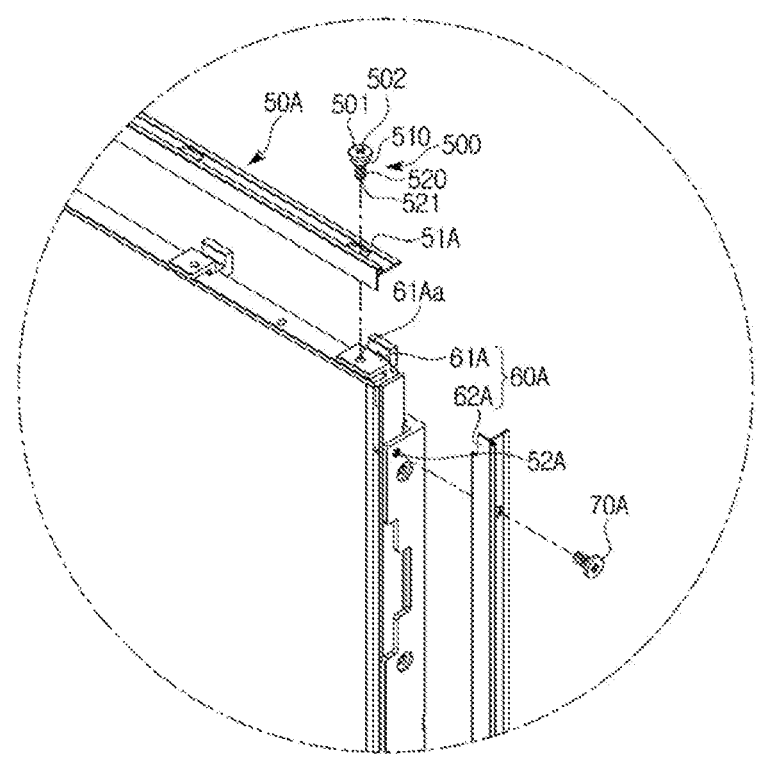
FIG. 22 is a diagram schematically illustrating a connecting member that is applied to a display module according to yet another exemplary embodiment.
Figure 23:
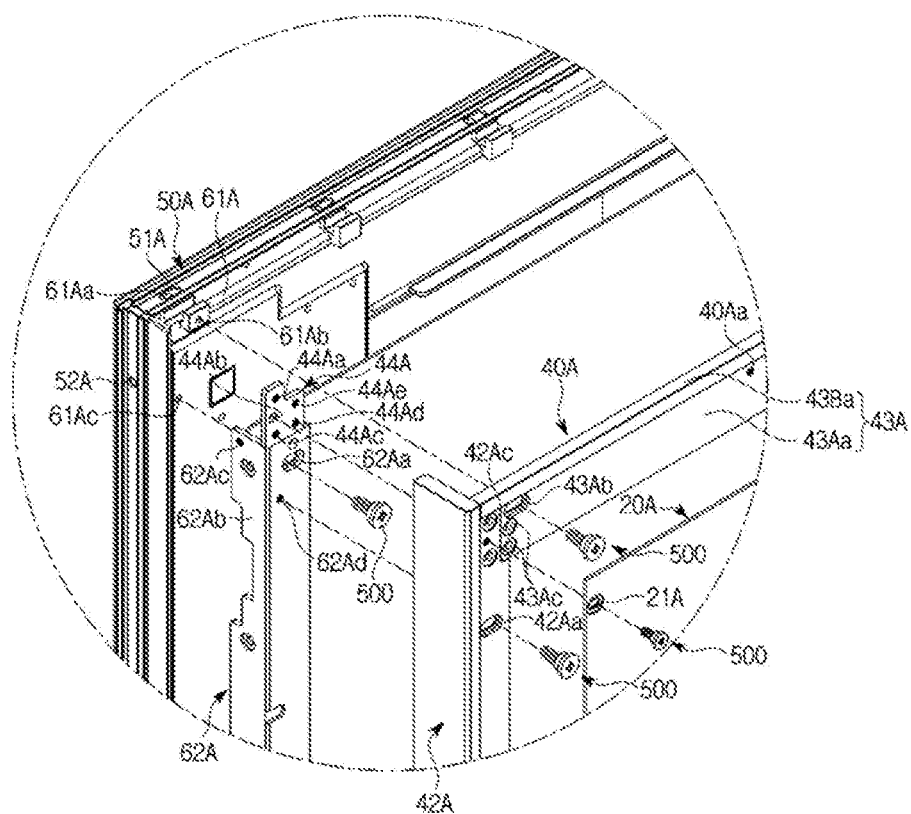
FIG. 23 is a diagram schematically illustrating a connecting member that is applied to a display module and a rear cover according to yet another exemplary embodiment.
Figure 24:
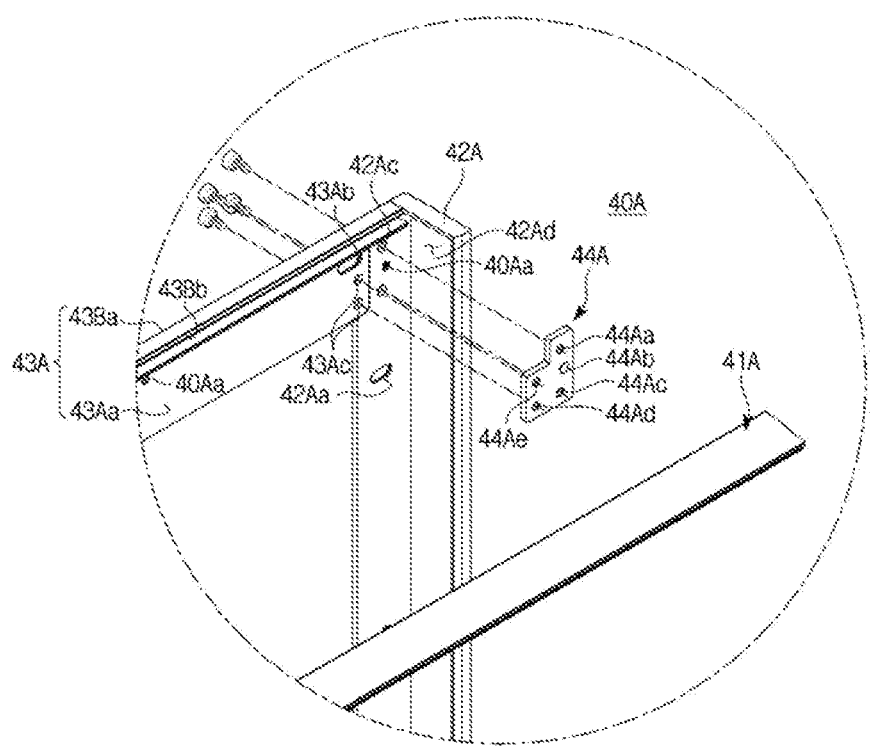
FIG. 24 is a partial perspective view schematically illustrating coupling of a side cover of a display apparatus according to yet another exemplary embodiment.
Figure 25:
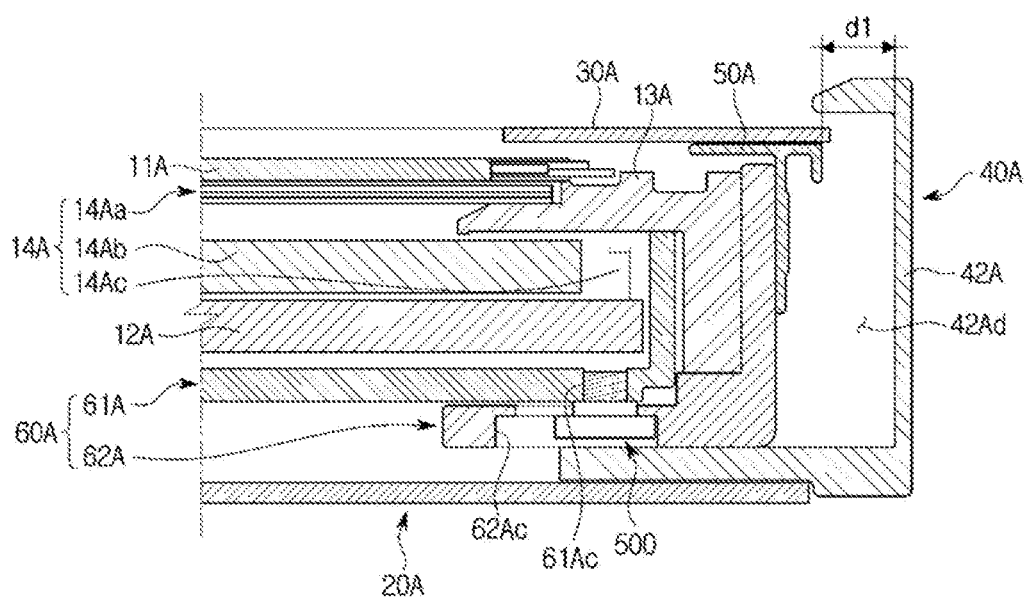
FIG. 25 is a cross-sectional view illustrating a display module, a side cover and a rear cover when a display apparatus according to yet another exemplary embodiment is in a flat surface state.
Figure 26:
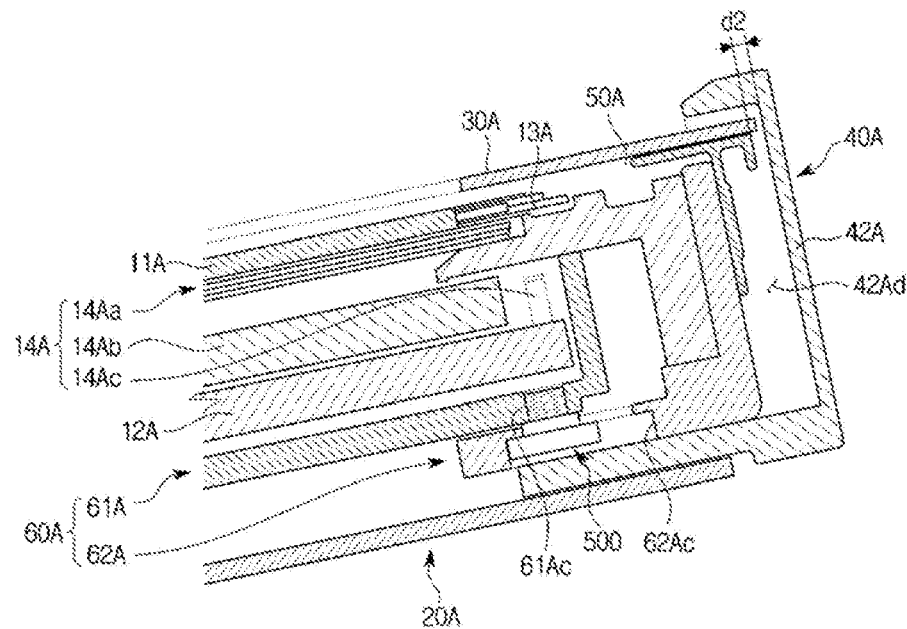
FIG. 26 is a cross-sectional view illustrating a display module, a side cover and a rear cover when a display apparatus according to yet another exemplary embodiment is in a curved surface state.
Figure 27:
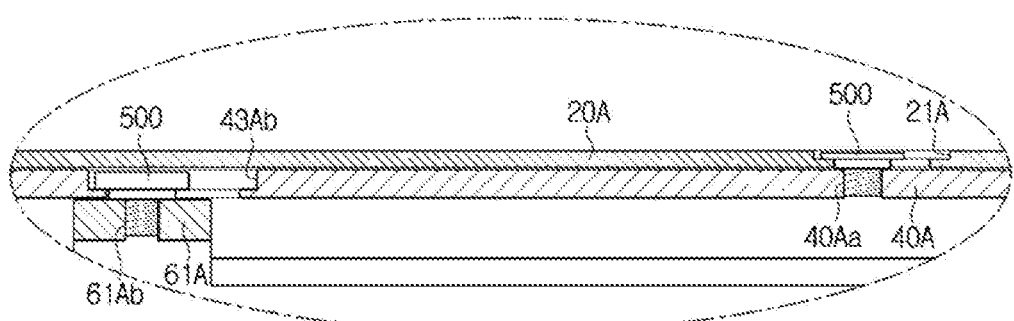
FIG. 27 is a cross-sectional view illustrating coupling of a side cover and a rear cover of a display apparatus according to yet another exemplary embodiment.

FIG. 22 is a diagram schematically illustrating a connecting member that is applied to a display according to yet another exemplary embodiment. FIG. 23 is a diagram schematically illustrating a connecting member that is applied to a display and a rear cover according to yet another exemplary embodiment. FIG. 24 is a partial perspective view schematically illustrating coupling of a side cover of a display apparatus according to yet another exemplary embodiment. FIG. 25 is a cross-sectional view illustrating a display, a side cover and a rear cover when a display apparatus according to yet another exemplary embodiment is in a flat surface state. FIG. 26 is a cross-sectional view illustrating a display, a side cover and a rear cover when a display apparatus according to yet another exemplary embodiment is in a curved surface state. FIG. 27 is a cross-sectional view illustrating coupling of a side cover and a rear cover of a display apparatus according to yet another exemplary embodiment.

As illustrated in FIGS. 22 to 27, the display module 10A includes the display panel 11A made of the liquid crystal panel, the backlight unit 14A that is positioned at the rear side of the display panel 11A and spaced apart from display panel 11A and emits light to the display panel 11A, the plurality of optical sheets 14Aa positioned at the rear side of the display panel 11A, a mid-mold 13A provided to support the display panel 11A, the first frame 50A positioned at a front side of the mid-mold 13A, and a second frame 60A that is positioned at a rear side of the mid-mold 13A and accommodates the backlight unit 14A therein.

The backlight unit 14A may include the plurality of optical sheets 14Aa positioned at the back of the display panel 11A, the light guide plate 14Ab, and the plurality of light emitting diodes 14Ac configured to supply light to the light guide plate 14Ab. The plurality of light emitting diodes 14Ac may be provided in a substrate 14A.

Also, the display module 10A may further include a front deco 30A that adheres to a front surface of the first frame 50A and forms an exterior of the display apparatus 1A, the rear cover 20A that is provided at the back of the second frame 60A and forms an exterior of the display apparatus 1A when viewed from the side, and the side cover 40A that is coupled to the rear cover 20A in a relatively movable manner and forms an exterior of the display apparatus 1A from viewed from the side.

In an exemplary embodiment, the front deco 30A, the side cover 40A, and the rear cover 20A may be made of a bendable material and shape to be changed together when the display module 10A is changed to the curved surface state.

The display module 10A may include the first frame 50A that is provided at the front side of the display panel 11A and forms an edge and the second frame 60A that is provided at the rear side of the display panel 11A and forms the rear surface of the display module 10A.

The first frame 50A covers an outer edge of the front surface of the display panel 11A and supports a state in which the display panel 11A is installed in the second frame 60A.

The second frame 60A may include a first bracket 61A provided to support the back such that the display module 10A may be accommodated and the second bracket 62A that is slidably movable in both directions of the first bracket 61A.

The first bracket 61A may be fixed to support the back of the display panel 11A. The second bracket 62A is slidably movable in both ends of the first bracket 61A.

When a state of the display module 10A is changed from the flat surface state to the curved surface state, a curvature of the first frame 50A that forms the front surface of the display module 10A should be changed greater than a curvature of the second frame 60A that forms the rear surface of the display module 10A.

For this purpose, the second frame 60A moves relative to the first frame 50A.

The hole 51A for fastening the first bracket 61A is formed on an upper surface and a lower surface of the first frame 50A. The hole 51A is formed as a long hole that extends in a horizontal direction of the display module 10A such that the first frame 50A may be movably coupled to the first bracket 61A by the connecting member 500.

A plurality of holes 51A are formed and may be positioned to have a predetermined interval there between in a horizontal direction of the display module 10A.

Meanwhile, the front deco 30A for forming an exterior of the display apparatus 1A may be provided in the front surface of the first frame 50A. The front deco 30A is adhered to the front surface of the first frame 50A and forms all edges of the front surface of the display panel 11A.

In an exemplary embodiment, the front deco 30A may be formed of the same color and the same material as the side cover 40A and the rear cover 20A.

A fixing hole 61Aa corresponding to the hole 51A is formed in the first bracket 61A of the second frame 60A. A plurality of fixing holes 61Aa are formed in the upper surface and the lower surface of the first bracket 61A.

The fixing hole 61Aa of the first bracket 61A is formed in the upper surface and the lower surface of the first bracket 61A to correspond to the hole 51A of the first frame 50A.

The connecting member 500 passes through the hole 51A of the first frame 50A and is fixed to the fixing hole 61Aa of the first bracket 61A.

The connecting member 500 includes a head 501, a first support 510 that extends and is integrally formed below the head 501, and a second support 520 that extends and is integrally formed below the first support 510.

The head 501 is provided in an upper end of the connecting member 500, and a connecting recess 502 that is recessed to insert a separate tool (not shown) for rotating the head 501 is formed at the center of the upper surface thereof. While exemplary embodiment illustrates the connecting recess 502 has a cross shape, the scope of exemplary embodiments is not limited thereto. For example, the connecting recess may include a line or hexagonal shape.

The first support 510 is formed to be stepped at a diameter smaller than that of the head 501. An outer circumferential surface of the first support 510 may be formed in a flat cylindrical shape such that the hole 51A may slide along the outer circumferential surface of the first support 510. In an outer circumferential surface of the second support 520 that is formed to have the same diameter as the first support 510, a thread 521 is formed.

The second support 520 is fixed to the fixing hole 61Aa of the first bracket 61A.

The first support 510 of the connecting member 500 is inserted into and passes through the hole 51A, and the second support 520 is fixed to the fixing hole 61Aa of the first bracket 61A.

In an exemplary embodiment, the first support 510 of the connecting member 500 is formed such that a corresponding portion thereof is not fixed but slides, and the second support 520 is formed such that a corresponding portion thereof is fixed.

Therefore, the first frame 50A through which the first support 510 of the connecting member 500 passes through the hole 51A may move relative to the first bracket 61A of the second frame 60A having the fixing hole 61Aa to which the second support 520 is fixed.

Also, the connecting member 500 allows the first bracket 61A and the second bracket 62A of the second frame 60A to be connected in a relatively movable manner.

The second bracket 62A positioned at both ends of a rear surface of the first bracket 61A is connected by the connecting member 500 to be movable relative to the first bracket 61A.

In a rear surface of the second bracket 62A, a connecting member hole 62Aa being a long hole extending in a horizontal direction of the display module 10A is formed. The connecting member 500 passing through the connecting member hole 62Aa is fixed to a connecting member fixing hole 61Ac of the first bracket 61A.

To correspond to the connecting member hole 62Aa of the second bracket 62A, a plurality of connecting member fixing holes 62Ac of the first bracket 61A may be formed in an upper end and a lower end of the rear surface of the first bracket 61A.

Therefore, according to an exemplary embodiment, the second support 520 of the connecting member 500 is fixed to the connecting member fixing hole 61Ac of the first bracket 61A, the first support 510 passes through the connecting member hole 62Aa of the second bracket 62A and is slidably movable, and the second bracket 62A moves relative to the first bracket 61A.

Also, in a side surface of the first frame 50A, a screw fastening hole 52A for fixing the second bracket 62A to the first frame 50A is formed. A plurality of screw fastening holes 52A may be formed to have a predetermined interval there between in both sides of the first frame 50A.

The plurality of screw fastening holes 52A may be coupled to the second bracket 62A of the second frame 60A through a screw 70A.

For this purpose, the second bracket 62A includes a bent surface 62Ab formed to be bent toward the front side of the display module 10A and a screw hole 62Ac formed to pass the bent surface 62Ab.

Fixing is performed through the screw 70A that passes through the screw fastening hole 52A of the first frame 50A and the screw hole 62Ac of the second bracket 62A.

Ends of the first frame 50A and the second frame 60A are fixed and connected.

Therefore, when the first frame 50A moves forward in order to change the display module 10A to the curved surface state, the second bracket 62A fixed to the first frame 50A through the screw 70A moves relative to the first bracket 61A along the connecting member hole 62Aa that has a long hole shape through which the connecting member 500 passes, and moves in both outer directions of the display module 10A.

Therefore, a curvature difference between the first frame 50A positioned in front of the display module 10A and the second frame 60A positioned at the back may be compensated for by relative movement of the second bracket 62A.

Meanwhile, as illustrated in FIG. 24, the side cover 40A forms an outer edge of the display apparatus 1A.

The side cover 40A may be made of a resin material, and a thin film of various colors may be adhered to an outer surface thereof. The side cover 40A may include various colors and materials to provide a sense of unity according to colors and materials of the display apparatus 1A.

The side cover 40A may include a first surface 41A forming an upper surface and a lower surface, the second surface 42A forming both side surfaces, and the third surface 43A forming a rear surface.

In the first surface 41A, the upper surface and the lower surface are formed as a pair and positioned to face each other. The first surface 41A is positioned outside the display module 10A to form an upper surface and a lower surface of the display apparatus 1A.

The second surface 42A is coupled to both ends of the first surface 41A, and may include both left and right sides and a rear surface that extends from both left and right sides.

In the second surface 42A, a plurality of connecting holes 42Ac and a moving slit 42Aa to which the connecting member 500 is coupled are formed. The connecting hole 42Ac is formed to be fixed to any of a plurality of fixing holes 44a, 44b, 44c, 44d and 44e of a connecting member 44A to be described. The moving slit 42Aa is formed to be coupled to the second bracket 62A through the connecting member 500.

Reference numeral 62Ad indicates a connecting member connecting hole 62Ad that is formed in the second bracket 62A for fixing the second surface 42A and the second bracket 62A according to an exemplary embodiment described with reference to FIG. 23.

The moving slit 42Aa is provided as a long hole that extends in a horizontal direction of the display module 10A. The connecting member 500 that has passed through the moving slit 42Aa is fixed to the connecting member connecting hole 62Ad of the second bracket 62A.

Therefore, in an exemplary embodiment, when the second bracket 62A moves, the second surface 42A of the side cover 40A connected to the second bracket 62A is slidably movable through the connecting member 500 coupled to the moving slit 42Aa, and the second bracket 62A and the side cover 40A may move relative to each other.

Meanwhile, the third surface 43A couples to a rear edge of the first surface 41A. The third surface 43A may form an upper back edge and a lower back edge of the display apparatus 1A. The third surface 43A may include an edge surface 43Ba and a rear surface 43Aa connected to the edge surface 43Ba.

The edge surface 43Ba of the third surface 43A includes a guide groove 43Bb that extends in a horizontal direction. The guide groove 43Bb is opened forward such that the first surface 41A is inserted and coupled thereto.

When the first surface 41A is inserted and coupled, and the side cover 40A is deformed, the guide groove 43Bb allows the first surface 41A to be slidably movable and coupled without a restriction.

In the rear surface 43Aa of the third surface 43A, a rear cover coupling groove 40Aa for coupling with the rear cover 20A, a moving slot 43Ab allowing the third surface 43A to be relatively movably coupled to the second frame 60A, and a fixing hole 43Ac configured to couple with any of a plurality of fixing holes 44Aa, 44Ab, 44Ac, 44Ad and 44Ae of the connecting member 44A may be formed.

The moving slot 43Ab of the third surface 43A is fixed to a connecting member fixing recess 61Ab of the first bracket 61A by the connecting member 500. The moving slot 43Ab of the third surface 43A is formed as a long hole that extends in a horizontal direction of the display module 10A.

To correspond to the moving slot 43Ab of the third surface 43A of the side cover 40A, a plurality of connecting member fixing recesses 61Ab may be formed in an upper end and a lower end of the rear surface of the first bracket 61A.

Therefore, in an exemplary embodiment, when the display module 10A is changed to a curved surface state, the third surface 43A of the side cover 40A is connected to be movable relative to the first bracket 61A through the moving slot 43Ab and the connecting member 500 fixed by the connecting member fixing recess 61Ab of the first bracket 61A.

Meanwhile, the second surface 42A and the third surface 43A forming the side cover 40A may be connected through the connecting member 44A.

The connecting member 44A may be positioned at each corner of the second surface 42A and the third surface 43A. The connecting member 44A may include at least one of the fixing holes 44Aa, 44Ab, 44Ac, 44Ad and 44Ac. While exemplary embodiment describes five fixing holes positioned in parallel to fix the gap between the second surface and the third surface that are formed in the connecting member 44A, exemplary embodiments are not limited thereto. For example, the number of fixing holes for connecting the second surface and the third surface may be changed.

The fixing holes 44Aa, 44Ab, 44Ac, 44Ad and 44Ae of the connecting member 44A include the first hole 44Aa positioned in one upper end, the second hole 44Ab positioned below the first hole 44Aa, the third hole 44Ac positioned below the second hole 44Ab, the fourth hole 44Ad positioned in parallel with the third hole 44Ac, and the fifth hole 44Ae positioned above the fourth hole 44Ad.

The first hole 44Aa positioned in one upper end of the connecting member 44A is coupled to the connecting hole 42Ac of the second surface 42A. The fourth hole 44Ad and the fifth hole 44Ae may be coupled to the fixing hole 43Ac of the third surface 43A.

Therefore, according to an exemplary embodiment, by fixing the plurality of fixing holes 44Aa, 44Ab, 44Ac, 44Ad and 44Ae to the second surface 42A and the third surface 43A, the connecting member 44A connects the second surface 42A and the third surface 43A. In this manner, the second surface 42A and the third surface 43A forming the side cover 40A may be connected through the connecting member 44A, and a detailed connecting configuration may be the same as described above, according to an exemplary embodiment.

In this manner, the side cover 40A detachably coupled in vertical and horizontal directions is provided such that the rear cover 20A is coupled to a rear surface thereof.

As illustrated in FIG. 25, the rear cover 20A of the display apparatus 1A may be coupled to the side cover 40A in a relatively movable manner.

A plurality of moving slits 21A are formed in the left and right of the rear cover 20A. The moving slit 21A is formed as a long hole that extends in a horizontal direction of the display module 10A. The connecting member 500 passing through the moving slit 21A is fixed to a rear cover fixing recess 40Aa of the side cover 40A.

In the second surface 42A and the third surface 43A of the side cover 40A, a plurality of rear cover fixing recesses 40Aa positioned to correspond to the moving slit 21A of the rear cover 20A are formed, according to an exemplary embodiment.

Therefore, when the display module 10A is changed to the curved surface state, the rear cover 20A may move relative to the side cover 40A by the connecting member 500 that is fastened to the side cover 40A by the moving slit 21A, according to an exemplary embodiment.

Meanwhile, according to such relative movement of the side cover 40A and the rear cover 20A, an interval between the first frame 50A and the side cover 40A in the flat surface state or the curved surface state of the display module 10A may be changed.

As illustrated in FIGS. 25 to 26, in the flat surface state of the display apparatus 1A, an interval between the side cover 40A and the first frame 50A is a first interval d1.

Also, when the display module 10A is changed to the curved surface state, an interval between the side cover 40A and the first frame 50A is decreased to a second interval d2.

Inside the second surface 42A of the side cover 40A, an accommodating portion 42Ad is provided to cover a length difference between d1 and d2 at left and right ends occurring when the display module 10A is changed to the curved surface state.

Therefore, when the display module 10A is changed to the curved surface state, the display panel 11A that moves to change the display module 10A to the curved surface state, the first frame 50A and the second frame 60A may be accommodated in the accommodating portion 42Ad formed in the second surface 42A of the side cover 40A.

When the display module 10A is changed to the curved surface state, both ends of the first frame 50A forming the front of the display panel 11A move forward. In this case, the second frame 60A that moves relative to the first frame 50A also moves forward due to the first frame 50A. The side cover 40A that moves relative to the second frame 60A also moves forward, and the rear cover 20A connected to the side cover 40A in a relatively movable manner also moves forward.

Therefore, according to an exemplary embodiment, through the first frame 50A and the second frame 60A forming the front surface and the rear surface of the display module 10A, respectively, and the side cover 40A and the rear cover 20A provided to be movable relative to the second frame 60A, it is possible to compensate for a curvature difference between the front surface and the rear surface of the display module 10A.

Meanwhile, according to an exemplary embodiment, there are provided a fastening structure for slide movement of the connecting member and the connecting member 500 enabling opponent parts to relatively move between the first frame 50A and the second frame 60A, between the second frame 60A and the side cover 40A, and between the side cover 40A and the rear cover 20A to change the display module 10A to the curved surface state. Positions to be formed and the number thereof may be changed according to a size and a shape of the display module 10A.

Figure 28:
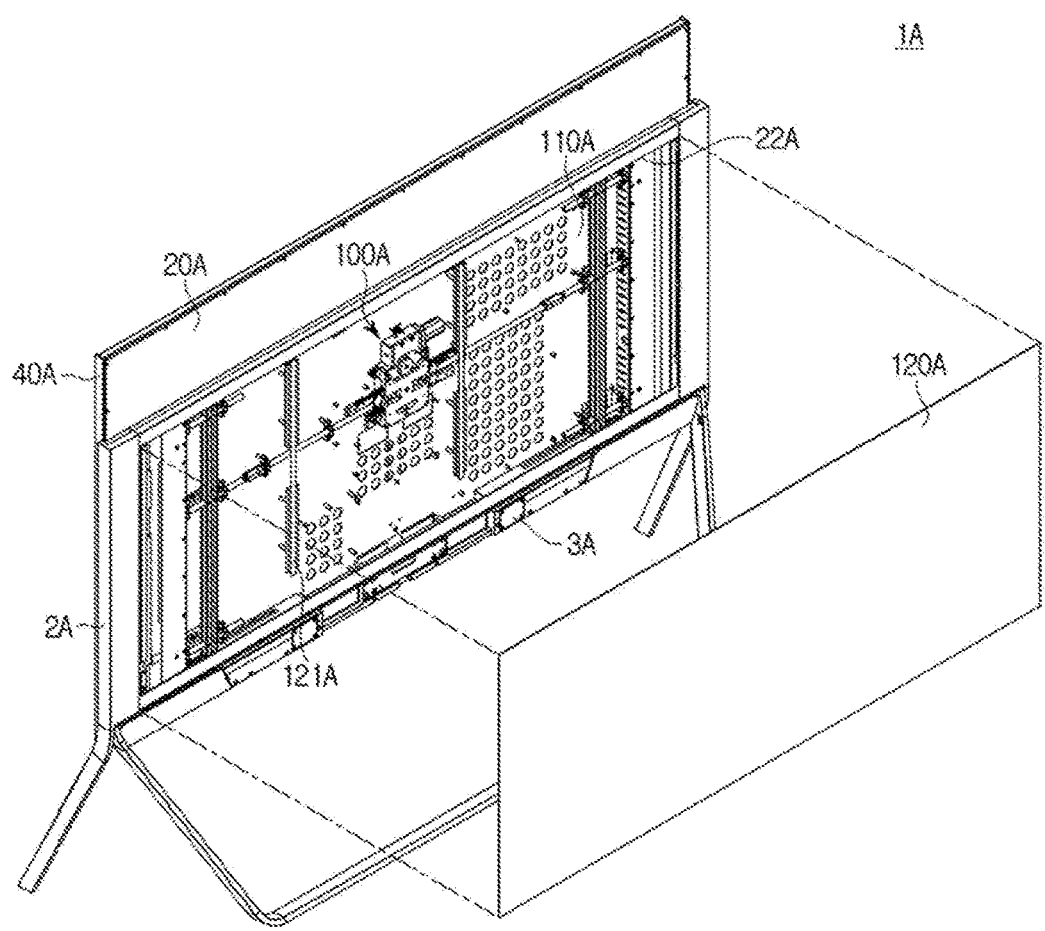
FIG. 28 is a diagram schematically illustrating a deformation apparatus of a display apparatus according to yet another exemplary embodiment.
Figure 29:
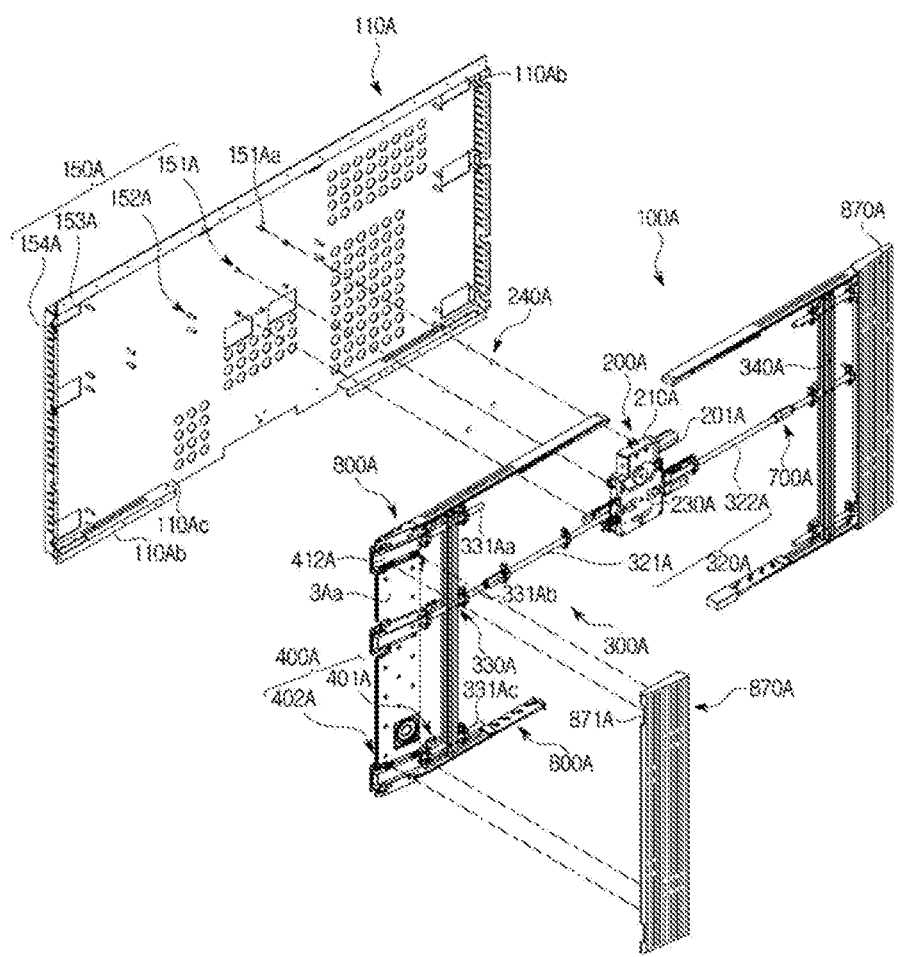
FIG. 29 is an exploded perspective view of a deformation apparatus that is applied to a display apparatus according to yet another exemplary embodiment.
Figure 30:
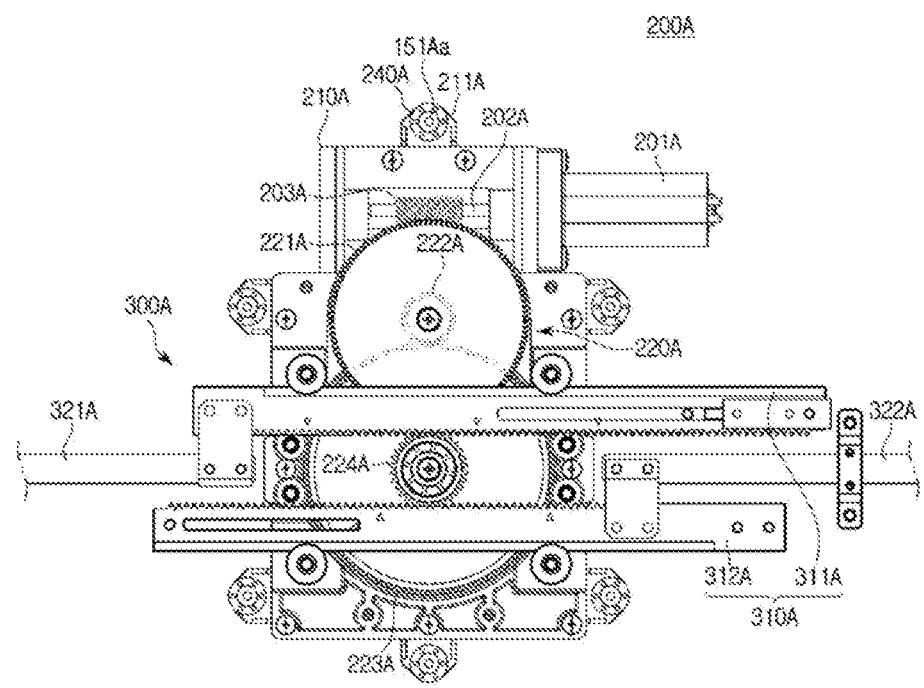
FIG. 30 is a diagram illustrating a driver of a deformation apparatus according to yet another exemplary embodiment.
Figure 31:
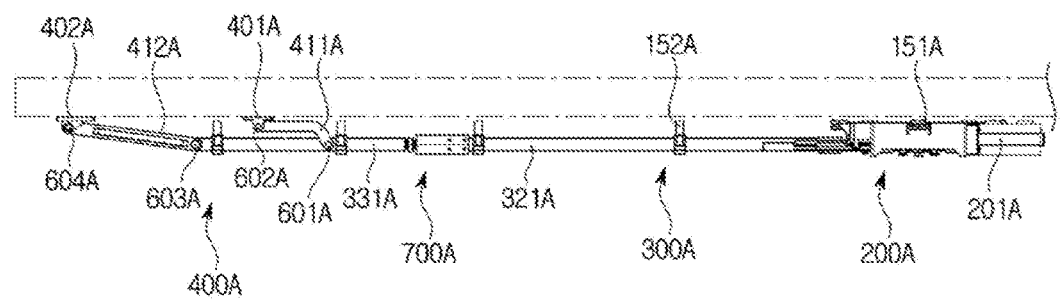
FIGS. 31 and 32 are diagrams illustrating operations of a deformation apparatus of a display apparatus according to yet another exemplary embodiment.

FIG. 27 is a diagram schematically illustrating a deformation apparatus of a display apparatus according to yet another exemplary embodiment. FIG. 28 is an exploded perspective view of a deformation apparatus that is applied to a display apparatus according to yet another exemplary embodiment. FIG. 29 is a diagram illustrating a driver of a deformation apparatus according to yet another exemplary embodiment. FIGS. 30 and 31 are diagrams illustrating operations of a deformation apparatus of a display apparatus according to yet another exemplary embodiment.

As illustrated in FIGS. 27 to 31, the display apparatus 1A includes the deformation apparatus 100A that can change the display module 10A to the flat surface state or the curved surface state according to an exemplary embodiment.

The deformation apparatus 100A is provided in the base plate 110A. The base plate 110A is installed at the deformation apparatus installation port 22A of the rear cover 20A. When the display is changed from the flat surface state to the curved surface state, the base plate 110A is positioned to support the display at the back of the display.

The rear case 120A is coupled to the base plate 110A. The rear case 120A is formed in a plate shape and may be formed to cover a rear surface of the base plate 110A.

The rear case 120A may be made of the same material and color as the stand 2A and form an exterior of the display apparatus 1A.

Meanwhile, inside the base plate 110A, according to an exemplary embodiment, at least one magnet 121A is installed and coupled to the rear case 120A. A plurality of magnets 121A are positioned to have an interval in a vertical direction of the display inside the base plate 110A and are coupled to the rear case 120A covering a rear surface thereof. The magnets 121A enables the rear case 120A to be firmly coupled to the base plate 110A without separation, thereby improving durability.

While an exemplary embodiment illustrates the two magnets 121A being vertically spaced from one another in both directions from the center of the base plate 110A, the scope of exemplary embodiments is not limited thereto. For example, the number and installation positions of magnets may be changed in various ways according to a size and a shape of the display.

Although not illustrated, in an upper end of the base plate 110A, a groove or a protrusion to which the rear case 120A is coupled is provided. In the rear case 120A, a coupling groove or coupling protrusion that corresponds to be coupled to the base plate 110A may be formed.

Also, a bar-shaped speaker device 3A may be provided in a lower end of the rear cover 20A, according to an exemplary embodiment.

The speaker device 3A is bendably provided in the lower end of the rear cover 20A and is changed in linkage with the rear cover 20A when a state of the display module 10A is changed to the flat surface state or the curved surface state.

The speaker device 3A may be changed to have a curvature corresponding to a variable curvature of the display module 10A.

Meanwhile, an exemplary embodiment in which the speaker device 3A further includes the speaker device 3A positioned in a vertical direction of the display module 10A inside a side blade 870A of a shield unit 800A to be described, the scope of exemplary embodiments are not limited thereto.

Also, while exemplary embodiment illustrate the speaker device 3A being formed in a bar shape in a lower end of the display apparatus 1A, the scope of exemplary embodiments is not limited thereto. For example, the speaker device may be positioned to extend in a vertical direction at both sides of the display.

The deformation apparatus 100A includes a driver 200A configured to generate power, a moving part 300A configured to receive power from the driver 200A and provided movably and a plurality of rotary parts 400A connected to the moving part 300A and provided in a rotatable state.

The driver 200A is positioned in an upper side of the back of the base plate 110A to be positioned at the center of the back of the display module 10A. Meanwhile, while exemplary embodiments illustrate the driver 200A being positioned in an upper side of the rear surface of the base plate 110A, the scope of exemplary embodiment is not limited thereto. For example, the driver 200A may be positioned at various positions of the base plate 110A that is positioned at the center of the back of the display module 10A.

As described above, the driver 200A, according to an exemplary embodiment, is positioned at the center of the back of the display module 10A. This allows distances of both ends of the driver 200A and the display to be substantially the same, according to an exemplary embodiment. When the driver 200A is positioned at the center of the display in this manner, power generated from the driver 200A may be uniformly delivered to both sides of the display, and therefore both ends of the display may be symmetrically deformed, according to an exemplary embodiment.

In the base plate 110A, a plurality of installation parts 150A in which the deformation apparatus 100A is installed are formed.

The installation part 150A includes a first installation part 151A in which the driver 200A is installed, a second installation part 152A in which the moving part 300A is installed, and a third installation part 153A in which the rotary part 400A is installed.

The first installation part 151A includes a plurality of coupling protrusions 151Aa that protrude from the base plate 110A such that the driver 200A is fixed. The plurality of coupling protrusions 151Aa are positioned to have a predetermined distance there between and vertically and horizontally support the driving unit 200A.

As illustrated in FIG. 28, the driver 200A of the deformation apparatus 100A may include a driver case 210A coupled to the first installation part 151A of the base plate 110A, a driving motor 201A provided inside the driver case 210A and configured to generate power, a gear 220A connected to the driving motor 201A, and a driver cover 230A provided to cover the driver case 210A and protect the internal gear 220A.

A coupling groove 211A to which the coupling protrusion 151Aa of the first installation part 151A is coupled is formed outside the driver case 210A. The driver case 210A may include a vibration isolating member 240A to prevent shaking and noise due to vibration of the driving motor 201A when it is assembled with the base plate 110A.

The vibration isolating member 240A may be positioned between the first installation part 151A of the base plate 110A and the coupling groove 211A of the driver case 210A. The vibration isolating member 240A is preferably made of an elastic material according to an exemplary embodiment.

The driving motor 201A is positioned outside an upper end of the driver case 210A. In a motor shaft 202A of the driving motor 201A, a worm 203A to be connected to the gear 220A may be formed.

The gear 220A includes a first gear 221A with which the worm 203A of the motor shaft 202A is formed to be engaged, a second gear 222A that is connected to and rotates coaxially with the first gear 221A, a third gear 223A that is spaced apart from the second gear 222A and rotates in engagement with the second gear 222A, and a fourth gear 224A that is connected to and rotates coaxially with the third gear 223A and is connected to the moving part 300A.

The moving part 300A includes a rack member 310A that is interlocked with an upper side and a lower side of the fourth gear 224A and moves in a direction opposite to each other, a moving link 320A that is connected to the rack member 310A, receives power, and linearly moves, and a connecting link 330A connected to the moving link 320A.

The moving link 320A of the moving part 300A may be installed in the second installation part 152A of the base plate 110A.

The moving link 320A is supported by the second installation part 152A and reciprocates in a horizontal direction of the display.

The rack member 310A includes a first rack 311A that is positioned in an upper side of the fourth gear 224A and connected thereto and a second rack 312A that is positioned in a lower side of the fourth gear 224A and is connected thereto. The first rack 311A and the second rack 312A move in directions opposite to each other according to a rotation of the driving motor 201A.

The moving link 320A is fixed to the rack member 310A to be linked with the rack member 310A.

The moving link 320A includes a first moving link 321A connected to the first rack 311A and a second moving link 322A connected to the second rack 312A.

Also, in each moving link 320A, the connecting link 330A connecting the moving link 320A and the rotary part 400A is formed such that power from the driver 200A may be distributed to the plurality of rotary parts 400A. The connecting link 330A is coupled to ends of the first moving link 321A and the second moving link 322A. The connecting link 330A connects the rotary part 400A and the moving link 320A.

Therefore, in an exemplary embodiment, each connecting link 330A may be formed in proportion to the number of rotary parts 400A. Also, the plurality of connecting links 330A (331Aa, 331Ab and 331Ac) may be connected by a connecting bracket 340A that extends vertically.

The connecting links 330A are connected by the connecting bracket 340A and may be positioned to have a predetermined distance there between. The connecting links 330A may include the upper connecting link 331Aa positioned in an upper end of the connecting bracket 340A, the lower connecting link 331Ac positioned in a lower end of the connecting bracket 340A, and a main connecting link 330Ab connected to the moving link 320A.

While an exemplary embodiment illustrates the connecting links 330A being connected to the rotary parts 400A that branch into three parts, the scope of exemplary embodiments is not limited thereto. For example, three or more or three or less rotary parts may be formed according to a size of the display.

Each of the connecting links 330A (331Aa, 331Ab and 331Ac) is connected to ends of the first moving link 321A and the second moving link 322A and moves along with the movement of the moving links 320A.

Meanwhile, the rotary part 400A is rotatably connected to the connecting link 330A. The rotary part 400A is connected to the upper connecting link 331Aa, the main connecting link 331Ab and the lower connecting link 331Ac.

The rotary part 400A includes a first rotating member 401A and a second rotating member 402A that is positioned more outwardly than the first rotating member 401A and provided in an outer end of the display.

Figure 32:
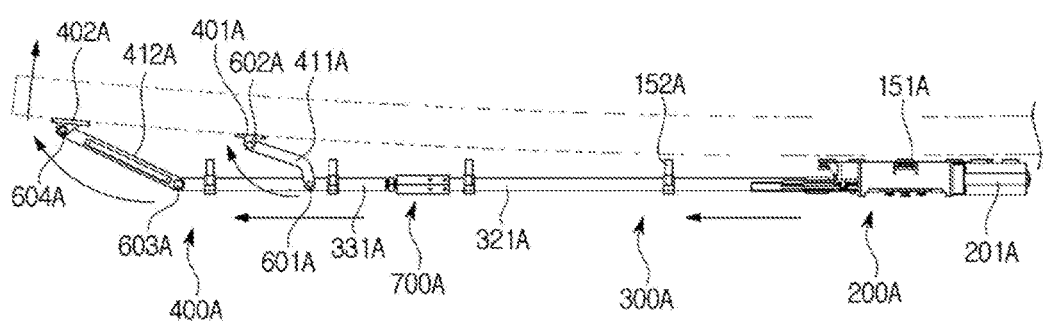

The first rotating member 401A is rotatably connected to the connecting link 330A through a first rotary link 411A, as shown in FIG. 32. One end of the first rotary link 411A is rotatably connected to the connecting link 330A through a first hinge 601A, and the other end thereof is rotatably connected to the first rotating member 401A through a second hinge 602A.

When the connecting link 330A moves, the first rotating member 401A rotates from the connecting link 330A and moves forward.

In this case, according to an exemplary embodiment, the first rotating member 401A is fixed to the rear cover 20A of the display apparatus 1A through the third installation part 153A of the base plate 110A, and when the connecting link 330A moves, presses the rear cover 20A forward according to rotation of the first rotary link 411A.

Also, the second rotating member 402A is rotatably connected to the connecting link 330A through a second rotary link 412A. One end of the second rotary link 412A is rotatably connected to an end of the connecting link 330A through a third hinge 603A, and the other end thereof is rotatably connected to the second rotating member 402A through a fourth hinge 604A.

When the connecting link 330A moves, the second rotating member 402A rotates from an end of the connecting link 330A and moves forward.

In this case, according to an exemplary embodiment, the second rotating member 402A is fixed to the rear cover 20A of the display apparatus 1A through an installation port 154A of the base plate 110A, and when the connecting link 330A moves, presses the rear cover 20A forward according to rotation of the second rotary link 412A.

In this manner, when the first rotating member 401A and the second rotating member 402A press the rear cover 20A forward, the display module 10A moves forward according to a force applied from the back, and the display module 10A is changed to the curved surface state accordingly.

Figure 33:
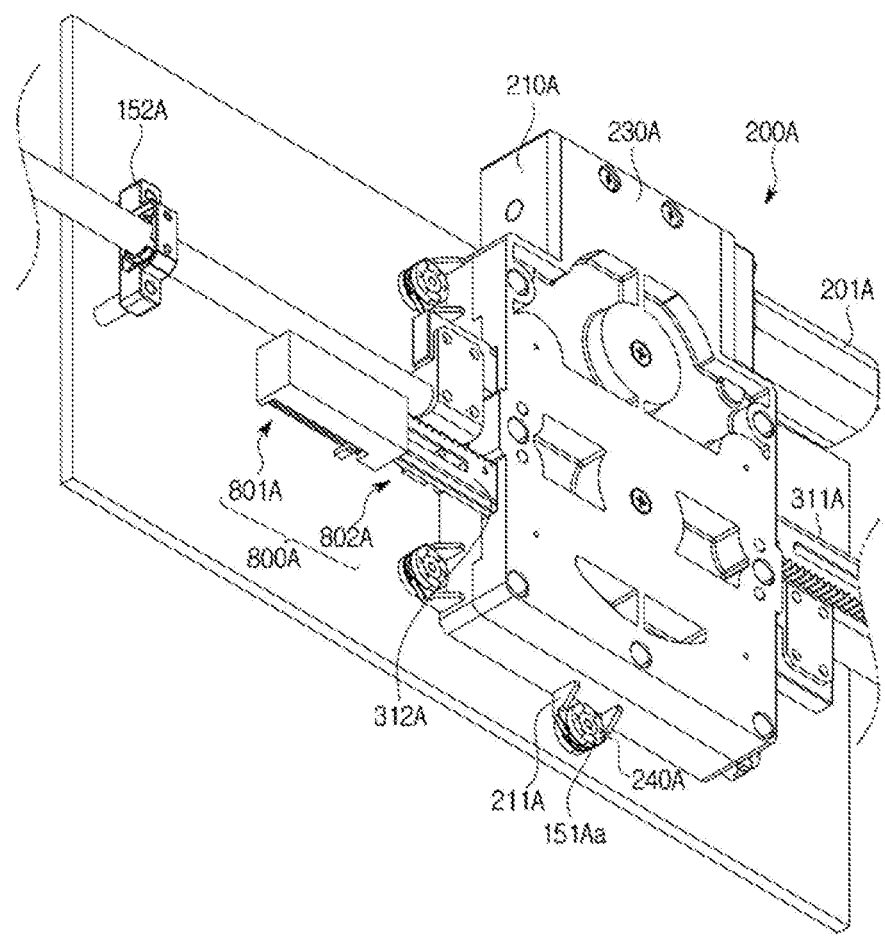
FIG. 33 is a diagram illustrating a sensor of a deformation apparatus according to yet another exemplary embodiment.

Meanwhile, as illustrated in FIG. 33, a plurality of sensors 800A configured to control the display apparatus 1A may be included, according to an exemplary embodiment.

The sensors 800A include a first sensor 801A configured to adjust a curvature of the display module 10A.

The first sensor 801A may be installed in at least one rack member 310A among the first rack 311A and the second rack 312A that move in opposite directions according to rotation of the driving motor 201A.

The first sensor 801A measures a moving distance of the rack member 310A. The first sensor 801A may include an optical sensor.

Also, the display apparatus 1A includes a second sensor 802A for restricting a moving distance of at least one of the first rack 311A and the second rack 312A.

The second sensor 802A detects a moving distance of any of the first rack 311A and the second rack 312A and blocks an operation of the driving motor 201A.

Therefore, according to an exemplary embodiment, when a curvature change in the display module 10A is a predetermined curvature or more, driving of the driving motor 201A is blocked by the second sensor 802A and a change of the display module 10A may be restricted.

The second sensor 802A may include a limit switch.

Also, although not illustrated, the sensors 800 may further include a detection sensor configured to detect an abnormal operation of the deformation apparatus 100A and the like when the display module 10A is changed to the curved surface state.

Figure 34:
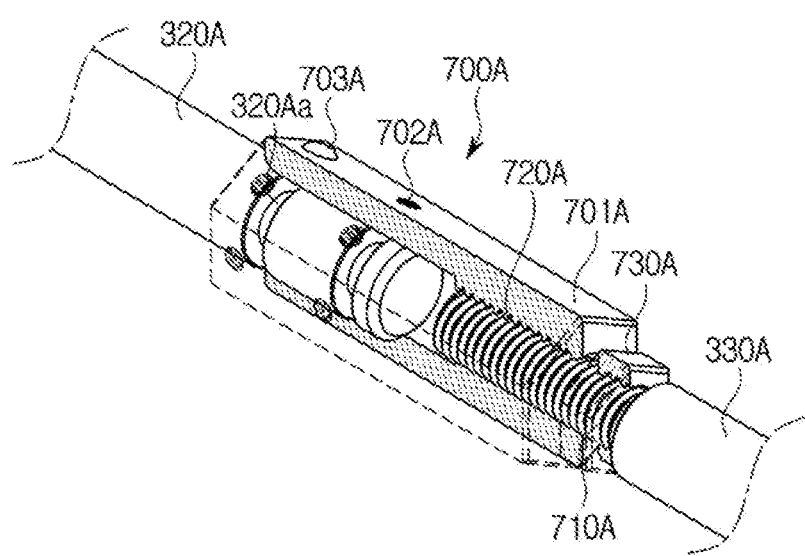
FIGS. 34 and 35 are diagrams illustrating a fine adjustment apparatus of a deformation apparatus according to yet another exemplary embodiment.

FIG. 34 is a diagram illustrating a fine adjustment apparatus of a deformation apparatus according to yet another exemplary embodiment.

Figure 35:
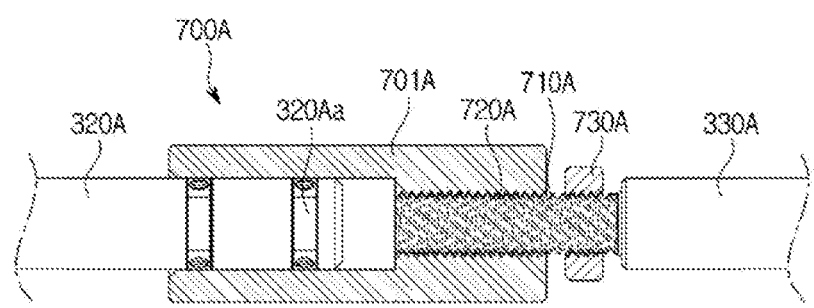

As illustrated in FIGS. 34 and 35, the deformation apparatus 100A configured to change the display module 10A of the display apparatus 1A to the curved surface state includes the moving part 300A.

The moving part 300A receives power from the driver 200A, moves in a horizontal direction, and changes the display module 10A to the curved surface state.

In this case, there is provided a fine adjustment apparatus 700A configured to finely adjust left and right balance of the display module 10A.

The fine adjustment apparatus 700A is installed between the moving link 320A and the connecting link 330A of the moving part 300A and may adjust an interval between the moving link 320A and the connecting link 330A. While an exemplary embodiment illustrates the fine adjustment apparatus 700A being installed between the moving link 320A and the connecting link 330A, the scope of exemplary embodiments is not limited thereto. For example, the fine adjustment apparatus may be installed in the moving link.

The fine adjustment apparatus 700A includes a first thread 710A that is formed in an end of at least one of the moving link 320A and the connecting link 330A and a rotary body 701A in which a second thread 720A corresponding to the first thread 710A is formed. The rotary body 701A has a hollow cylindrical shape having one end coupled to the moving link 320A and the other end coupled to the connecting link 330A.

In one side of an outer circumferential surface of the rotary body 701A, an insertion hole 702A into which a fixing member 730A such as a bolt is inserted is formed. The rotary body 701A may be fixed to the moving link 320A through the insertion hole 703A. In an end of the moving link 320A, a fixing recess 320Aa for fixing the rotary body 701A may be formed.

The rotary body 701A is rotatably provided between the moving link 320A and the connecting link 330A. The second thread 720A is formed in an inner end of the rotary body 701A.

Therefore, when the rotary body 701A rotates, the rotary body 701A moves by the first thread 710A corresponding to the second thread 720A of the rotary body 701A, and therefore the interval between the moving link 320A and the connecting link 330A is changed.

While an exemplary embodiment illustrates the first thread 710A is formed in an end of the connecting link 330A, the scope of exemplary embodiments is not limited thereto.

Meanwhile, the rotary body 701A coupled to the first thread 710A may adjust the interval between the connecting link 330A and the moving link 320A according to the rotation.

The fine adjustment apparatus 700A may further include an interval adjustment bolt 730A configured to restrict movement of the rotary body 701A. The interval adjustment bolt 730A is rotatably provided in the first thread 710A of the connecting link 330A and supports the rotary body 701A.

In this manner, the fine adjustment apparatus 700A may be used to adjust a step and a left and right gap of the display panel 11A of the display apparatus 1A. When left and right balance of the display panel 11A is uniformly adjusted, it is possible to uniformize horizontal movement rate of the display panel 11A when the display module 10A is changed to the curved surface state.

Figure 36:
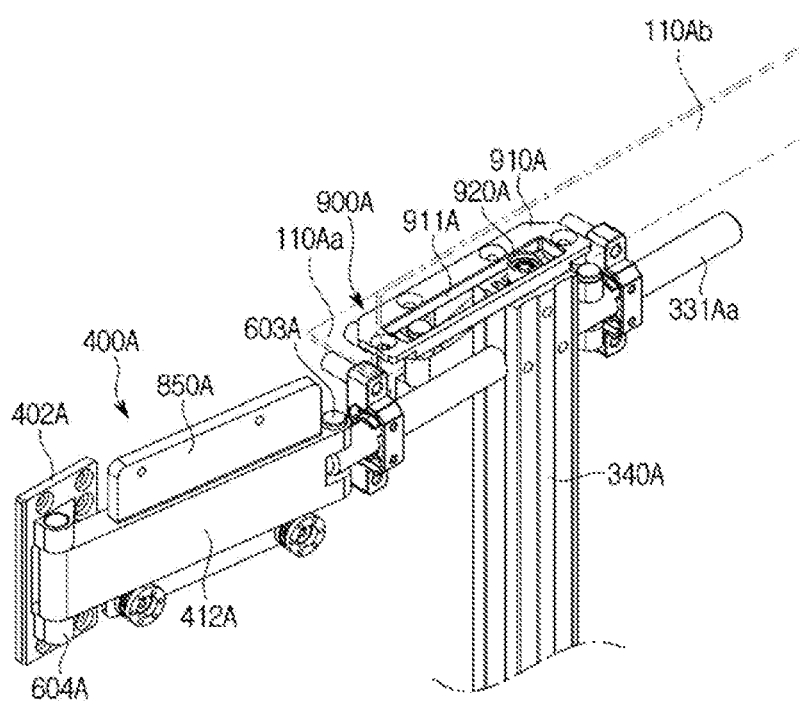
FIG. 36 is a diagram illustrating a guide of a deformation apparatus according to yet another exemplary embodiment.

FIG. 36 is a diagram illustrating a guide of a deformation apparatus according to yet another exemplary embodiment.

As illustrated in FIG. 36, the deformation apparatus 100A configured to change the display module 10A to the curved surface state includes a guide 900A configured to guide movement of the moving part 300A for left and right balance when a state of the display module 10A is changed.

In the moving part 300A that horizontally moves by power received from the driving unit 200A, power should be uniformly delivered to upper, lower, left, and right corners of the display module 10A.

The guide 900A includes a guide protrusion 920A formed in the connecting bracket 340A of the moving part 300A and a guide bracket 910A in which a guide slot 911A guiding the guide protrusion 920A is formed.

The guide protrusion 920A protrudes from an upper end and a lower end of the connecting bracket 340A. The guide slot 911A may be formed in the guide bracket 910A that is installed on an upper surface 110Aa and a lower surface (not shown) of the base plate 110A.

The guide bracket 910A is installed in both ends of the upper surface 110Aa and the lower surface (not shown) of the base plate 110A. The guide slot 911A is formed in a horizontal direction of the display module 10A such that the guide protrusion 920A is inserted and moves in a horizontal direction.

Therefore, when power is delivered from the driver 200A and the moving link 320A moves in a horizontal direction, the connecting bracket 340A connected to the moving link 320A moves in linkage therewith, the connecting link 330A connected to the connecting bracket 340A moves together, and the rotary part 400A rotatably connected to the connecting link 330A rotates and moves the display module 10A forward.

In this case, according to an exemplary embodiment, the guide protrusion 920A formed in the upper end and the lower end of the connecting bracket 340A is guided by the guide slot 911A of the base plate 110A and stably moves. Accordingly, the display module 10A may be uniformly changed to a curved surface shape without a loss of power delivered from the driver 200A.

In this manner, the guide 900A of the deformation apparatus 100A is equally applied to the upper end and the lower end of the connecting bracket 340A.

Also, when the guide protrusion 920A is formed in a cylindrical shape and both end shapes of the guide slot 911A are formed in a circular shape corresponding to the guide protrusion 920A, it is possible to prevent noise generated between the guide protrusion 920A and the guide slot 911A.

Figure 37:
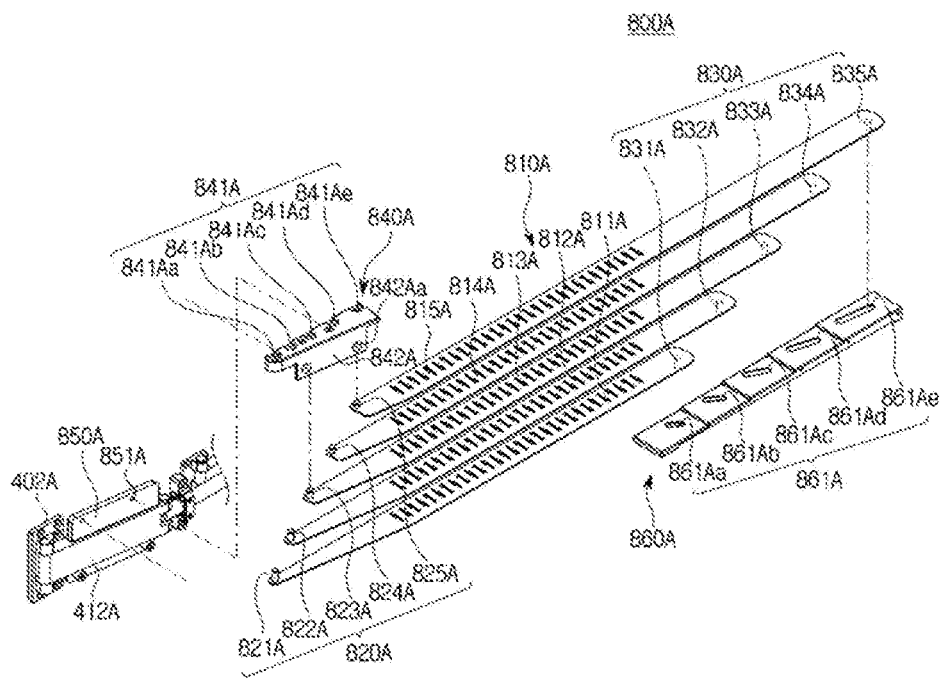
FIG. 37 is an exploded perspective view of a shield of a display apparatus according to yet another exemplary embodiment.
Figure 38:
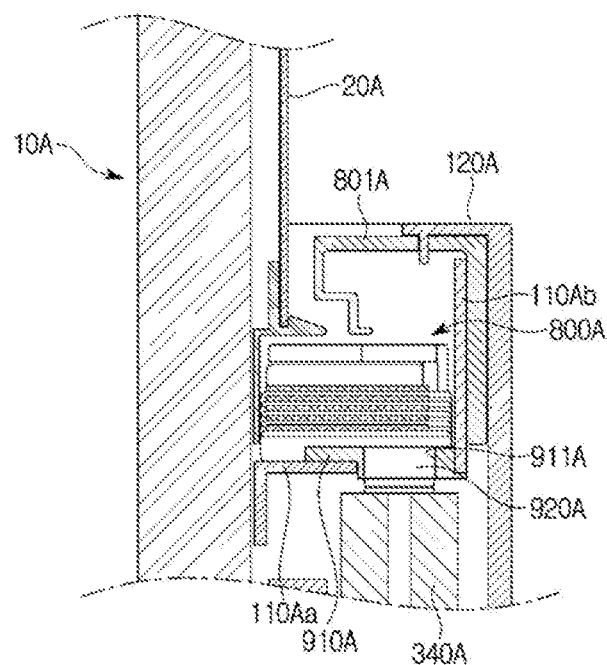
FIG. 38 is a cross-sectional view illustrating a shield of a display apparatus according to yet another exemplary embodiment.
Figure 39:
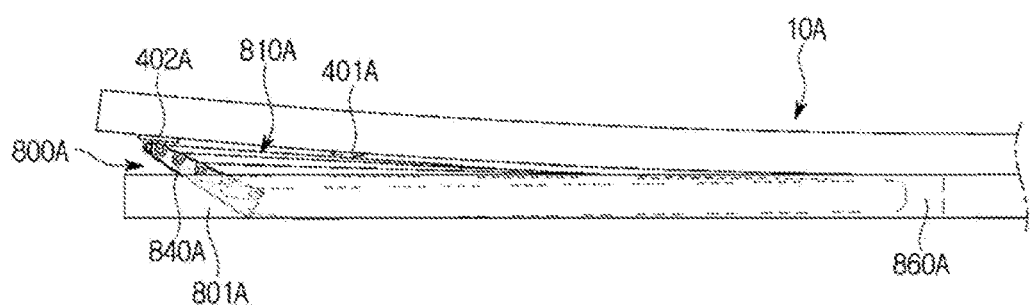
FIG. 39 is a diagram illustrating an operation of a shield of a display apparatus according to yet another exemplary embodiment.
Figure 40:
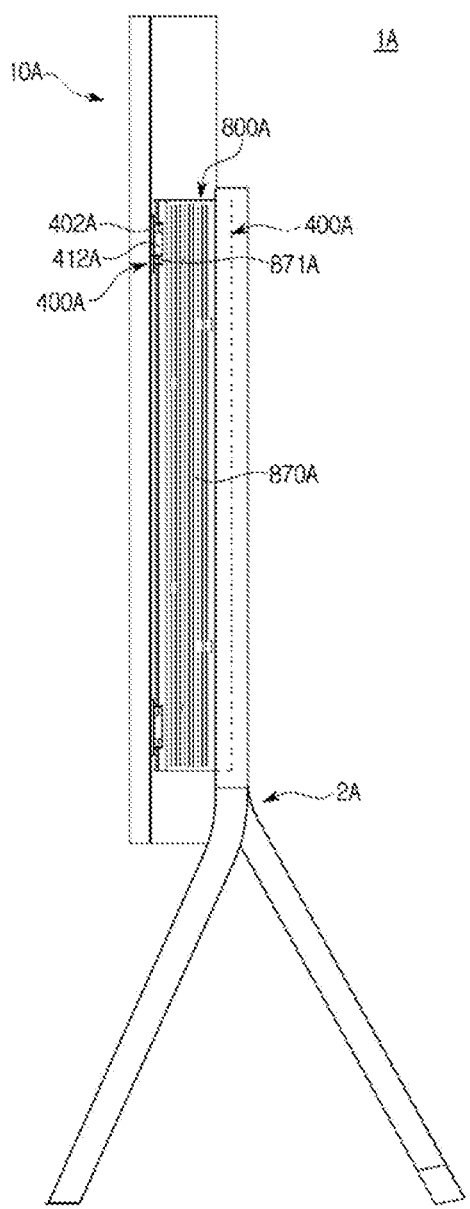
FIG. 40 is a side view illustrating an operation of a shield of a display apparatus according to yet another exemplary embodiment.

FIG. 37 is a cross-sectional view illustrating a shield of a display apparatus according to yet another exemplary embodiment. FIG. 38 is an exploded perspective view illustrating a shield of a display apparatus according to yet another exemplary embodiment. FIG. 39 is an exploded perspective view of a shield of a display apparatus according to yet another exemplary embodiment. FIG. 40 is a cross-sectional view illustrating a shield of a display apparatus according to yet another exemplary embodiment.

As illustrated in FIGS. 37 to 40, the display apparatus 1A is provided to cover an exposure space generated when the display module 10A is changed to the curved surface state.

As illustrated in FIG. 37, the shield 800A is positioned at both ends of the upper surface 110Aa and a lower surface 100Ac of the base plate 110A, according to an exemplary embodiment.

The base plate 110A may include an installation plate 110Ab that is bent upward and extends from the upper surface 110Aa. The installation plate 100Ab may also be bent downward from the lower surface 100Ac.

In the installation plate 110Ab, a shield case 801A (FIG. 38) formed to surround an upper outside of the base plate 110A may be installed. The shield case 801A surrounds the upper surface 110Aa of the base plate 110A, thereby improving an exterior of the display apparatus 1A.

In this case, the shield case 801A is formed of the same color and the same material as the rear case 120A and provides a sense of unity.

The shield 800A includes a plurality of blades 810A and moving guide members 840A and 860A that enable both ends of the blade 810A to rotate.

The moving guide members 840A and 860A include the first moving guide member 840A connected to one end of the blade 810A and the second moving guide member 860A connected to the other end of the blade 810A.

The blade 810A is laminated and disposed, has a plate shape, rotates according to a curvature change of the display module 10A through the first moving guide member 840A, moves forward, and covers an exposure space between the display module 10A and the rear case 120A.

The blade 810A may include a first blade 811A positioned in the lowermost end, a second blade 812A laminated above the first blade 811A, a third blade 813A laminated above the second blade 812A, a fourth blade 814A laminated above the third blade 813A, and a fifth blade 815A laminated above the fourth blade 814A. While an exemplary embodiment illustrates that the number of blades 810A is 5, the scope of exemplary embodiments is not limited thereto. For example, the number of blades may be changed in various ways according to a size and a shape of the display.

Each of the blades 810A, 811A, 812A, 813A, 814A and 815A includes guide protrusions 820A and 830A that are connected to the first moving guide member 840A and the second moving guide member 860A.

The guide protrusions 820A and 830A include the first guide protrusion 820A that is rotatably coupled to the first moving guide member 840A at one end of each blade 810A. The first guide protrusion 820A protrudes upward from an upper surface of each blade 810A.

Also, in the other end of each blade 810A, the second guide protrusion 830A rotatably coupled to the second moving guide member 860A is formed. The second guide protrusion 830A protrudes downward from a lower surface of each blade 810A.

Meanwhile, the first moving guide member 840A includes a plurality of guide protrusion-grooves 841A (841Aa, 841Ab, 841Ac, 841Ad and 841Ae) to which the first guide protrusion 820A formed in each blade 810A may be coupled. In the first moving guide member 840A, a plurality of guide protrusion-grooves 841A are formed on an upper surface thereof, and a guide bracket coupling unit 842A to be coupled with the second rotary link 412A of the moving part 300A is formed on a side surface thereof.

In this case, according to an exemplary embodiment, the plurality of guide protrusion-grooves 841A are positioned to have a predetermined distance there between in a horizontal direction of the display module 10A and enable the first blade 811A to the fifth blade 815A to sequentially rotate.

A guide bracket 850A is coupled to the second rotary link 412A and rotates along with rotation of the second rotary link 412A. In the guide bracket 850A, a coupling unit 851A to which the first moving guide member 840A is coupled is formed.

Therefore, when the second rotary link 412A rotates, the guide bracket 850A connected to the second rotary link 412A rotates, and the first moving guide member 840A coupled to the guide bracket 850A rotates.

In this case, according to an exemplary embodiment, the first guide protrusion 820A coupled to the guide protrusion-groove 841A of the first moving guide member 840A is in linkage with rotation of the first moving guide member 840A, and sequentially rotates and moves forward from the first blade 811A to the fifth blade 815A.

The second moving guide member 860A is provided on the upper surface 110Aa of the base plate 110A. The second moving guide member 860A has a plate shape that extends in a horizontal direction of the display module 10A and is disposed such that an end of the blade 810A is coupled thereto.

The second moving guide member 860A includes a plurality of guide slots 861A (861Aa, 861Ab, 861Ac, 861Ad and 861Ae) to which the second guide protrusion 830A of the first blade 811A to the fifth blade 815A is rotatably coupled.

The plurality of guide slots 861A are disposed to have a predetermined distance therebetween in a horizontal direction of the display module 10A and enable the first blade 811A to the fifth blade 815A to sequentially rotate.

The plurality of guide slots 861A may include the first guide slot 861Aa to which a second guide protrusion 831A of the first blade 811A is coupled to be movable, the second guide slot 861Ab to which a second guide protrusion 832A of the second blade 812A is coupled to be movable, the third guide slot 861Ac to which a second guide protrusion 833A of the third blade 813A is coupled to be movable, the fourth guide slot 861Ad to which a second guide protrusion 834A of the fourth blade 814A is coupled to be movable, and the fifth guide slot 861Ae to which a second guide protrusion 835A of the fifth blade 815A is coupled to be movable.

In this case, according to an exemplary embodiment, the first guide slot 861Aa is formed to have a shorter length than the second guide slot 861Ab, the second guide slot 861Ab is formed to have a shorter length than the third guide slot 861Ac, the third guide slot 861Ac is formed to have a shorter length than the fourth guide slot 861Ad, and the fourth guide slot 861Ad is formed to have a shorter length than the fifth guide slot 861Ae.

This is because moving distances of the first blade 811A to the fifth blade 815A are different.

Meanwhile, the shield 800A includes the side blade 870A configured to cover a side surface among exposed areas between both ends of the display module 10A that moves forward when the display module 10A is changed to the curved surface state and the base plate 110A provided at the back thereof.

The side blade 870A is formed to extend in a vertical direction of the display module 10A, that is, in an up and down direction. The side blade 870A is connected to the second rotary link 412A of the rotary part 400A of the deformation apparatus 100A and rotates along with the second rotary link 412A when the second rotary link 412A rotates.

A rotary link installation part 871A to which the second rotary link 412A is connected may be provided in the side blade 870A. The rotary link installation part 871A may be formed in an upper end and a lower end of the side blade 870A.

Also, an outer end of the side blade 870A is connected to the fourth hinge 604A that couples the second rotary link 412A and the second rotating member 402A in a rotatable manner.

Therefore, in order to change the display module 10A to the curved surface state, according to an exemplary embodiment, when the deformation apparatus 100A is driven, the second rotary link 412A and the second rotating member 402A rotatably move and move the display module 10A forward, the side blade 870A connected to the second rotary link 412A rotates along therewith.

The side blade 870A that rotates and moves in this manner may prevent a side surface between the display module 10A and the base plate 110A in which the deformation apparatus 100A is provided from being exposed to the outside.

A pair of side blades 870A are provided in one end and the other end of the display module 10A, respectively.

The pair of side blades 870A cover both sides of the display module 10A and protect an inside when the display module 10A is changed to the curved surface state.

When the display module 10A is changed to the curved surface state, as the display module 10A moves forward, the second rotary link 412A fixed to the rear cover 20A of the display module 10A and the first moving guide member 840A fixing the blade 810A rotate together, and the first blade 811A to the fifth blade 815A connected to the first moving guide member 840A sequentially spread.

The spread first blade 811A to the fifth blade 815A cover an upper exposure space between the display module 10A and the base plate 110A.

Also, the side blade 870A connected to the second rotary link 412A rotates and moves along with the second rotary link 412A and may cover an exposure space of both sides of the display module 10A.

That is, when the display module 10A is changed to the curved surface state, by the shield unit 800A formed of the blade 810A and the side blade 870A, exposure spaces of upper ends and both ends between the display module 10A and the base plate 110A are covered. Therefore, it is possible to prevent a foreign material such as dust from being introduced into the display apparatus 1A, thereby improving durability.

Also, it is possible to protect an internal space of the display module 10A and prevent internal components and the like from being exposed, thereby improving beauty.

As is apparent from the above description of exemplary embodiments, a display apparatus may use a display by selecting a flat surface state or curved surface state of the display.

In addition, deformation of the display may be prevented by a slidable structure when the display is switched to the flat surface state or curved surface state. Thereby, product quality may be improved.

Although a few exemplary embodiments have been shown and described, it would be appreciated by those skilled in the art that changes may be made to the exemplary embodiments without departing from the principles and spirit of the present disclosure, the scope of an inventive concept is defined in the claims and their equivalents. That is, the foregoing describes illustrative, non-limiting embodiments are not to be construed as limiting. Although a few exemplary embodiments have been described, those skilled in the art will readily appreciate that many modifications are possible in exemplary embodiments without materially departing from an inventive concept. Accordingly, all such modifications are intended to be included within the scope of an inventive concept. Therefore, it is to be understood that the foregoing are illustrative, exemplary embodiments and an inventive concept is not to be construed as limited to exemplary embodiments disclosed, and that modifications to exemplary embodiments, as well as other embodiments, are intended to be included within the scope of an inventive concept.

What is claimed is:

1. A display apparatus, comprising: a display module which includes: a display panel configured to display images, the display panel being bendable; a top chassis configured to accommodate a front of the display panel; a first bottom chassis configured to support a back of the display panel; and a second bottom chassis configured to slide from the first bottom chassis; and a connecting member configured to connect the top chassis, the first bottom chassis, and the second bottom chassis, in a movable manner; and the connecting member comprises: a head; a first support integrally formed at a lower end of the head; and a second support extending from a lower end of the first support, the second support being provided with threads; the top chassis is provided with a long fastening hole allowing the first support of the connecting member to be slidably fastened thereto when the display panel moving in forward and backward directions.

2. The display apparatus according to claim 1, wherein the display panel comprises an organic light emitting diode panel.

3. The display apparatus according to claim 1, further comprising a driving apparatus positioned at a back of the display module such that the display module is switched into one of a flat surface state and a curved surface state.

4. The display apparatus according to claim 3, wherein the driving apparatus comprises:
   a driver fixed to a base member positioned at a back of the display module so as to generate a driving force;
   moving members moved by the driver in opposite directions with respect to each other; and
   rotating members rotatably connected to the moving members so as to rotate both ends of the display module in forward and backward directions.

5. A display apparatus comprising: a bendable display panel provided to switch into one of a flat surface state and a curved surface state; a top chassis provided at a front of the display panel; and a bottom chassis, provided at a back of the display panel, configured to move relative to the top chassis; and the bottom chassis comprises: a first bottom chassis configured to support a back of the display panel; and a second bottom chassis configured to slide from the first bottom chassis, wherein the second bottom chassis moves relative to the top chassis; a connecting member configured to connect the top chassis and the bottom chassis in a movable manner with respect to each other, wherein the connecting member is fixed to the bottom chassis by passing through the top chassis; and the connecting member comprises: a head; a first support integrally formed at a lower end of the head; and a second support extending from a lower end of the first support, the second support being provided with threads; the top chassis is provided with a long fastening hole allowing the first support of the connecting member to be slidably fastened thereto when the display panel moving in forward and backward directions.

\* \* \* \* \*